(12) United States Patent
Sasaki et al.

(10) Patent No.: US 11,508,834 B2
(45) Date of Patent: Nov. 22, 2022

(54) COMPOUND SEMICONDUCTOR DEVICE

(71) Applicant: Murata Manufacturing Co., Ltd., Kyoto-fu (JP)

(72) Inventors: Kenji Sasaki, Nagaokakyo (JP); Kingo Kurotani, Nagaokakyo (JP); Takashi Kitahara, Nagaokakyo (JP); Shigeki Koya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 194 days.

(21) Appl. No.: 17/097,937

(22) Filed: Nov. 13, 2020

(65) Prior Publication Data

US 2021/0066479 A1 Mar. 4, 2021

Related U.S. Application Data

(63) Continuation-in-part of application No. 16/568,154, filed on Sep. 11, 2019, now Pat. No. 10,868,155, (Continued)

(30) Foreign Application Priority Data

Nov. 27, 2014 (JP) ................................. 2014-240327

(51) Int. Cl.
  *H01L 29/73* (2006.01)
  *H01L 29/737* (2006.01)
  (Continued)

(52) U.S. Cl.
  CPC ...... *H01L 29/7371* (2013.01); *H01L 23/4824* (2013.01); *H01L 23/535* (2013.01);
  (Continued)

(58) Field of Classification Search
  CPC ............. H01L 29/7371; H01L 23/4824; H01L 23/535; H01L 24/13; H01L 27/0823;
  (Continued)

(56) References Cited

U.S. PATENT DOCUMENTS 5,469,108 A 11/1995 Tserng
5,734,193 A 3/1998 Bayraktaroglu et al.
(Continued)

FOREIGN PATENT DOCUMENTS

CN 1501510 A 6/2004
JP 2000-106386 A 4/2000
(Continued)

OTHER PUBLICATIONS

An Office Action; "Notice of Reasons for Rejection," issued by the Japanese Patent Office dated Aug. 10, 2016, which corresponds to Japanese Patent Application No. 2014-240327 and is related to U.S. Appl. No. 14/932,497; with English language translation.
(Continued)

*Primary Examiner* — Yasser A Abdelaziez
(74) *Attorney, Agent, or Firm* — Studebaker & Brackett PC

(57) ABSTRACT

A compound semiconductor device comprises a heterojunction bipolar transistor including a plurality of unit transistors, a capacitor electrically connected between a RF input wire and a base wire for each unit transistor of the unit transistors, and a bump electrically connected to emitters of the unit transistors. The unit transistors are arranged in a first direction. The bump is disposed above the emitters of the unit transistors while extending in the first direction. The transistors include first and second unit transistors, the respective emitters of the first and second unit transistors being disposed on first and second sides, respectively, of a second direction, perpendicular to the first direction, with
(Continued)

respect to a center line of the bump extending in the first direction. The capacitor is not covered by the bump, and respective lengths of the respective base wires connected respectively to the first and second unit transistors are different.

17 Claims, 22 Drawing Sheets

Related U.S. Application Data which is a continuation-in-part of application No. 16/355,172, filed on Mar. 15, 2019, now Pat. No. 10,714,602, which is a continuation of application No. 15/709,017, filed on Sep. 19, 2017, now Pat. No. 10,276,701, which is a continuation of application No. 14/932,497, filed on Nov. 4, 2015, now Pat. No. 9,825,156.

(51) Int. Cl.
    *H01L 23/00* (2006.01)
    *H01L 23/482* (2006.01)
    *H01L 29/417* (2006.01)
    *H01L 29/06* (2006.01)
    *H01L 23/535* (2006.01)
    *H01L 27/082* (2006.01)
    *H01L 29/40* (2006.01)
    *H03F 3/19* (2006.01)

(52) U.S. Cl.
    CPC .......... *H01L 24/13* (2013.01); *H01L 27/0823* (2013.01); *H01L 29/0692* (2013.01); *H01L 29/40* (2013.01); *H01L 29/41708* (2013.01); *H03F 3/19* (2013.01); *H01L 24/05* (2013.01); *H01L 24/16* (2013.01); *H01L 2224/0401* (2013.01); *H01L 2224/1302* (2013.01); *H01L 2224/13013* (2013.01); *H01L 2224/16227* (2013.01); *H01L 2924/13051* (2013.01); *H03F 2200/408* (2013.01); *H03F 2200/451* (2013.01)

(58) Field of Classification Search
    CPC ................. H01L 29/0692; H01L 29/40; H01L 29/41708; H01L 24/05; H01L 24/16; H01L 2224/0401; H01L 2224/13013; H01L 2224/1302; H01L 2224/16227; H01L 2924/13051; H01L 2224/13006; H01L 2224/13014; H01L 2224/13023; H01L 27/0755; H01L 29/20; H01L 2224/13028; H03F 3/19; H03F 2200/408; H03F 2200/451; H03F 3/195
See application file for complete search history.

(56) References Cited

U.S. PATENT DOCUMENTS

| | | | |
|---|---|---|---|
| 6,034,383 A | 3/2000 | Bayraktaroglu | |
| 7,282,997 B2 | 10/2007 | Salove | |
| 7,566,920 B2 | 7/2009 | Kawashima et al. | |
| 7,705,425 B2 | 4/2010 | Ma et al. | |
| 2003/0085412 A1 | 5/2003 | Nakamura et al. | |
| 2004/0036544 A1* | 2/2004 | Ota | H01L 27/0658 257/E29.183 |
| 2004/0061131 A1 | 4/2004 | Winslow | |
| 2004/0164407 A1 | 8/2004 | Nakajima et al. | |
| 2006/0108665 A1 | 5/2006 | Kurokawa et al. | |
| 2006/0138460 A1 | 6/2006 | Sasaki et al. | |
| 2006/0244012 A1 | 11/2006 | Wang | |
| 2006/0249752 A1 | 11/2006 | Asano | |
| 2006/0267148 A1 | 11/2006 | Ma et al. | |
| 2007/0205432 A1 | 9/2007 | Tsukao | |
| 2010/0109052 A1 | 5/2010 | Nakajima et al. | |
| 2013/0256849 A1* | 10/2013 | Danny | H01P 5/107 257/664 |
| 2014/0002188 A1 | 1/2014 | Chen et al. | |
| 2014/0077883 A1 | 3/2014 | Griffith et al. | |
| 2014/0312390 A1 | 10/2014 | Tsai et al. | |
| 2015/0326181 A1 | 11/2015 | Chen et al. | |
| 2015/0326182 A1 | 11/2015 | Chen et al. | |
| 2015/0326183 A1 | 11/2015 | Chen et al. | |
| 2016/0064324 A1* | 3/2016 | Ajuria | H01L 23/3114 438/396 |

FOREIGN PATENT DOCUMENTS

| | | |
|---|---|---|
| JP | 2001-044214 A | 2/2001 |
| JP | 2004-095714 A | 3/2004 |
| JP | 2008-131017 A | 6/2008 |
| JP | 2010-267944 A | 11/2010 |
| TW | 200405651 A | 4/2004 |
| TW | 201415790 A | 4/2014 |

OTHER PUBLICATIONS

Notification of the First Office Action issued by the State Intellectual Property Office of the People's Republic of China dated Jan. 30, 2018, which corresponds to Chinese Patent Application No. 201510829130.0 and is related to U.S. Appl. No. 15/709,017.

* cited by examiner

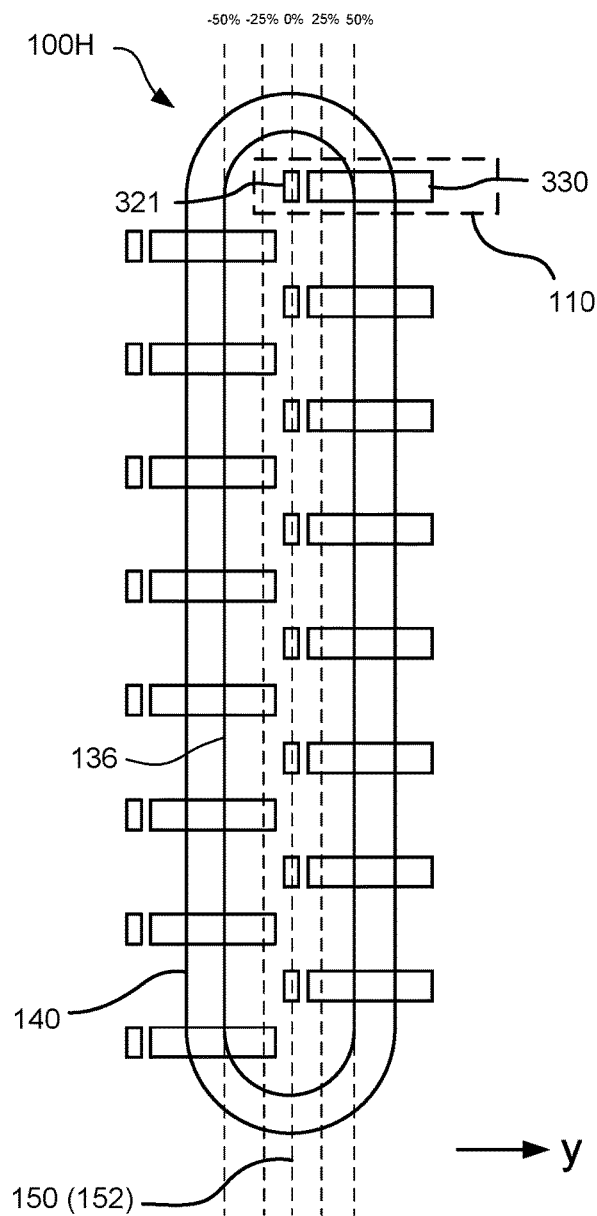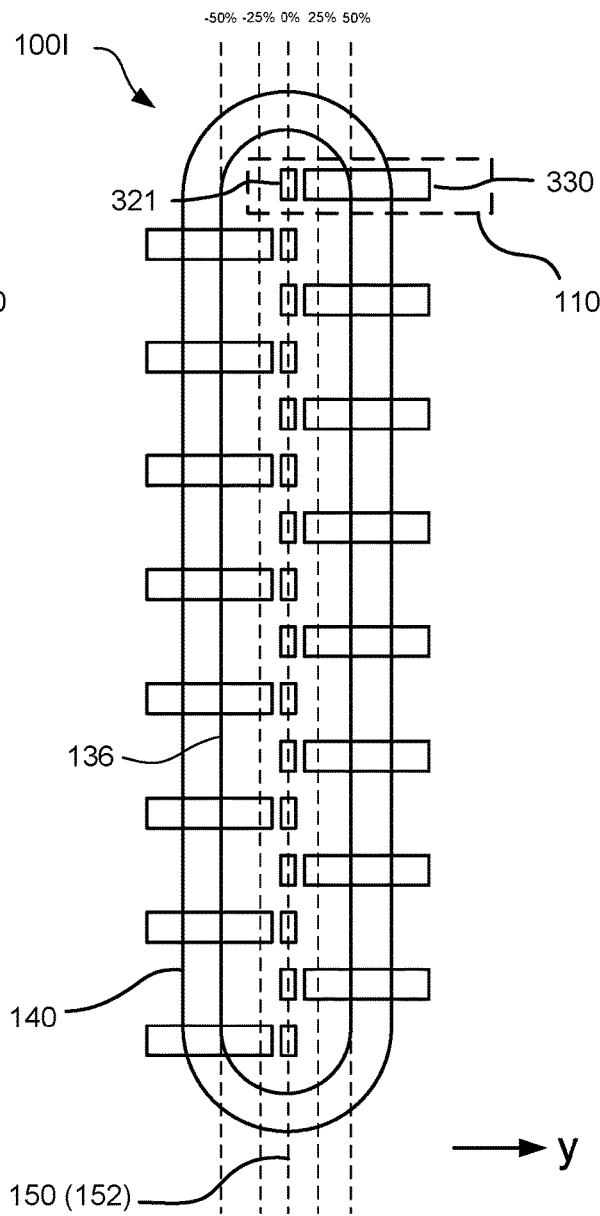

ly at higher collector-emitter (Vcc) operating voltages. Collector current collapse at higher power output levels is caused by self-heating in a unit emitter finger, and thermal coupling among the fingers resulting in non-uniform temperature distributions and unbalanced current distribution among the multi-fingered HBTs. Collector current collapse affects output power, efficiency and linearity characteristics of the power devices.

COMPOUND SEMICONDUCTOR DEVICE

CROSS REFERENCE TO RELATED APPLICATIONS

This application is a Continuation-in-Part of U.S. patent application Ser. No. 16/568,154, filed on Sep. 11, 2019, which is a Continuation-in-Part of U.S. patent application Ser. No. 16/355,172, filed on Mar. 15, 2019, which is a Continuation of U.S. patent application Ser. No. 15/709,017 filed on Sep. 19, 2017, which is a Continuation of U.S. patent application Ser. No. 14/932,497 filed on Nov. 4, 2015, which claims benefit of priority to Japanese Patent Application No. 2014-240327 filed on Nov. 27, 2014, the entire contents of which are incorporated herein by reference.

TECHNICAL FIELD

The present disclosure relates to a compound semiconductor device and a power amplifier module.

BACKGROUND

In a mobile communication device, such as a cellular phone, a power amplifier module is used for amplifying power of a radio-frequency (RF) signal to be transmitted to a base station. In a power amplifier module, a compound semiconductor device including a heterojunction bipolar transistor (HBT) as an amplifier element is used.

In accordance with smaller sizes of recent mobile communication devices, it is also desirable to reduce the size of compound semiconductor devices. In order to satisfy this demand, as disclosed in Japanese Unexamined Patent Application Publication No. 2000-106386, for example, flip-chip mounting may be used instead of wire bonding as a technique for mounting a compound semiconductor device on a module substrate.

With increased communications rates of 5th generation networks technologies and beyond, the requirements for high quality output power from an HBT amplifier module is expected to continually increase.

SUMMARY

In the configuration disclosed in the above-described publication, a plurality of unit transistors are linearly arranged, and a bump is provided over the emitters of the unit transistors. With this configuration, the emitters, which are heat sources, are disposed close to each other. This may increase the thermal resistance.

The present disclosure has been made in view of the above-described background. It is an object of the present disclosure to reduce the thermal resistance in a compound semiconductor device including an HBT constituted by a plurality of unit transistors.

With an increase in output power, DC I-V characteristics of multi-fingered parallel connected HBTs can suffer from an undesirable condition in which collector current collapses at higher collector-emitter (Vcc) operating voltages. Collector current collapse at higher power output levels is caused by self-heating in a unit emitter finger, and thermal coupling among the fingers resulting in non-uniform temperature distributions and unbalanced current distribution among the multi-fingered HBTs. Collector current collapse affects output power, efficiency and linearity characteristics of the power devices.

In the HBT device configuration of a related device 1 shown in FIG. 19, plural unit transistors 2 are linearly arranged along the x-axis direction on a semiconductor substrate 4. Each unit transistor includes a sub-collector layer 12, a collector layer 14, a base layer 20, base electrode 21, an emitter layer 30, and an emitter electrode 31 provided in this order on the semiconductor substrate 4. A bump 40, such as a copper pillar bump (CPB), is provided over a dielectric layer (not shown) on the unit transistors 11. Bump 40 has a center in the x direction shown by center line 50 and is electrically connected to the emitter electrode 31 of each of the unit transistors 11 by way of a conductor filled via opening 36 and metal 2 layer 34.

The inventors realized that with the configuration of the related HBT device 10, an area 42 of the base layer around the base electrode is the hottest part of the unit transistor during operation, and the thermal resistance of the related semiconductor device 10 is sufficiently high that collector current collapse occurs at higher collector emitter voltages. FIG. 20 is an I-V characteristic of the related semiconductor device 10 showing this phenomenon for Vcc voltages greater than 4 volts.

The present disclosure presents HBT device structure that focuses on decreasing the thermal resistance of the HBT device plurality of unit transistors in the hottest part of the unit HBTs to prevent occurrence of current collapse, and thus maintain desirable transistor characteristics during high output power operation.

A semiconductor device according to this disclosure comprises a heterojunction bipolar transistor (HBT). The HBT includes plural unit transistors, each unit transistor including a collector layer, base layer, and emitter layer. The HBT comprises a base electrode on the base layer, an emitter electrode on the emitter layer, base wires respectively electrically connecting the base electrodes of the unit transistors to an input terminal, a metallization layer electrically connecting the emitter electrode of each of the plural unit transistors to each other, and having first portions respectively over each of the emitter electrodes and second portions respectively overhanging each of the base electrodes. A dielectric layer is positioned over the metallization layer and includes a conductor filled via opening overlying each of the plural unit transistors. A bump elongated in a length direction is positioned above the plural unit transistors has a width in a width direction transverse to the length direction. For each of the plurality of unit transistors, the bump electrically connects the metallization layer with the conductor filled via opening therebetween. For each of the plural unit transistors, the overlying via opening overlaps in a plan view a width portion of the bump, the width portion having a center coinciding with a center of the bump in the width direction and extending along at least 50 percent of the width of the bump, and the entirety of the base electrode is positioned in the plan view within a region of the via opening extending along 50 percent of the width of the via opening and having a center coinciding with a center of the via opening.

According to embodiments of the present disclosure, it is possible to reduce the thermal resistance in a compound semiconductor device including an HBT constituted by a plurality of unit transistors.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIGS. 17B and 17C illustrate other examples in which emitters are displaced from the center line of a bump alternately toward one side (+y side) and the other side (−y side).

DETAILED DESCRIPTION

Figure 1:
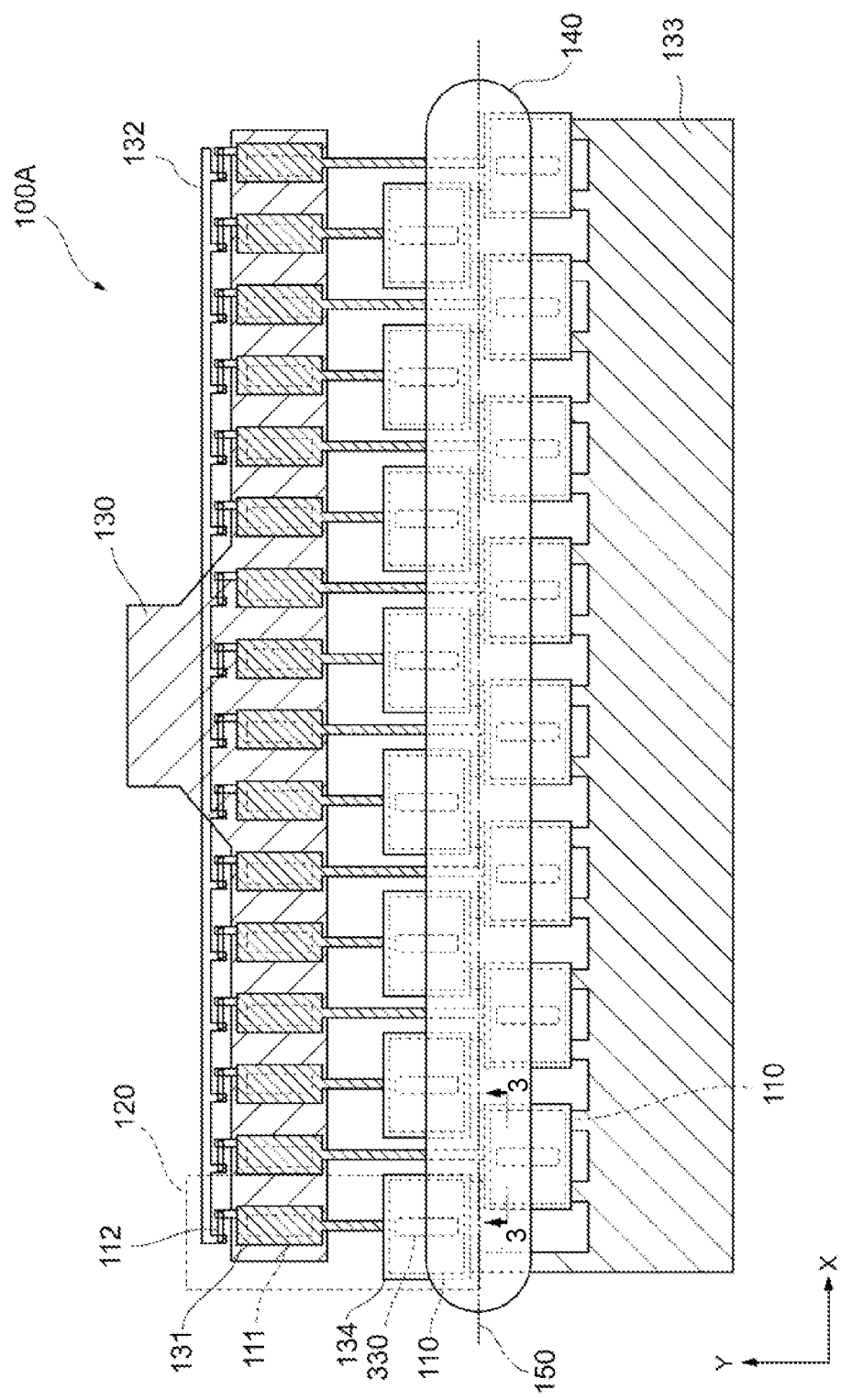
FIG. 1 is a plan view of a compound semiconductor device according to an embodiment of the disclosure.

FIG. 1 is a plan view of a compound semiconductor device 100A according to an embodiment of the disclosure.

Figure 2:
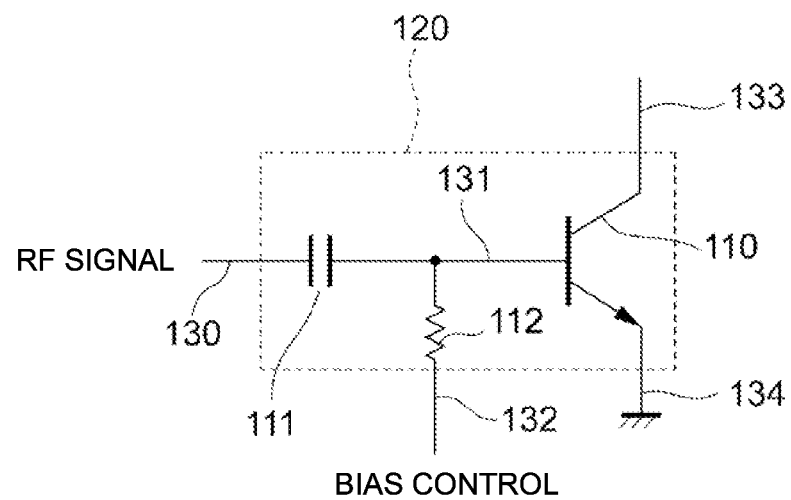
FIG. 2 is a circuit diagram of a cell forming the compound semiconductor device shown in FIG. 1.
Figure 3:
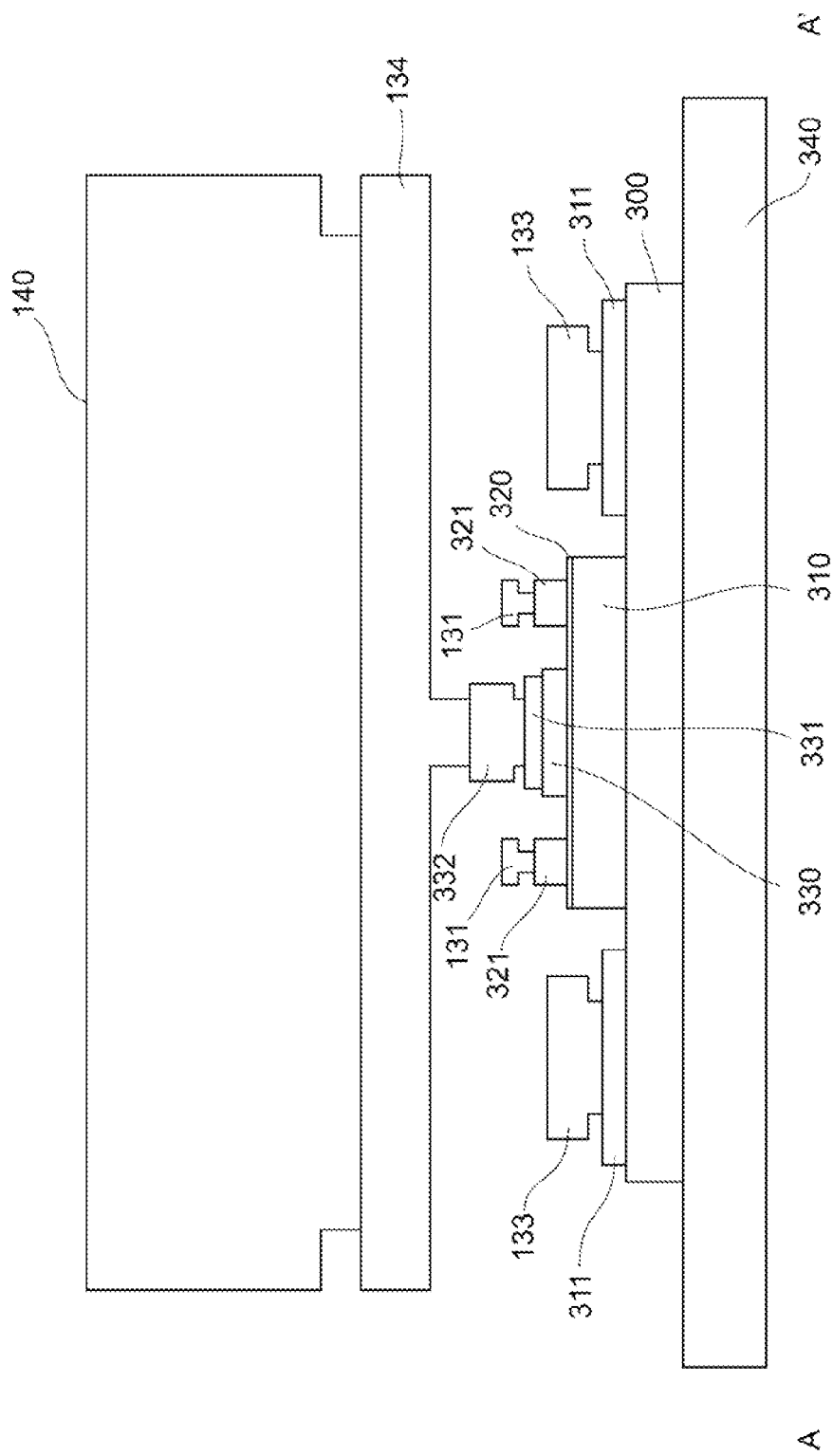
FIG. 3 is a sectional view of the compound semiconductor device taken along line 3-3 of FIG. 1.
Figure 4:
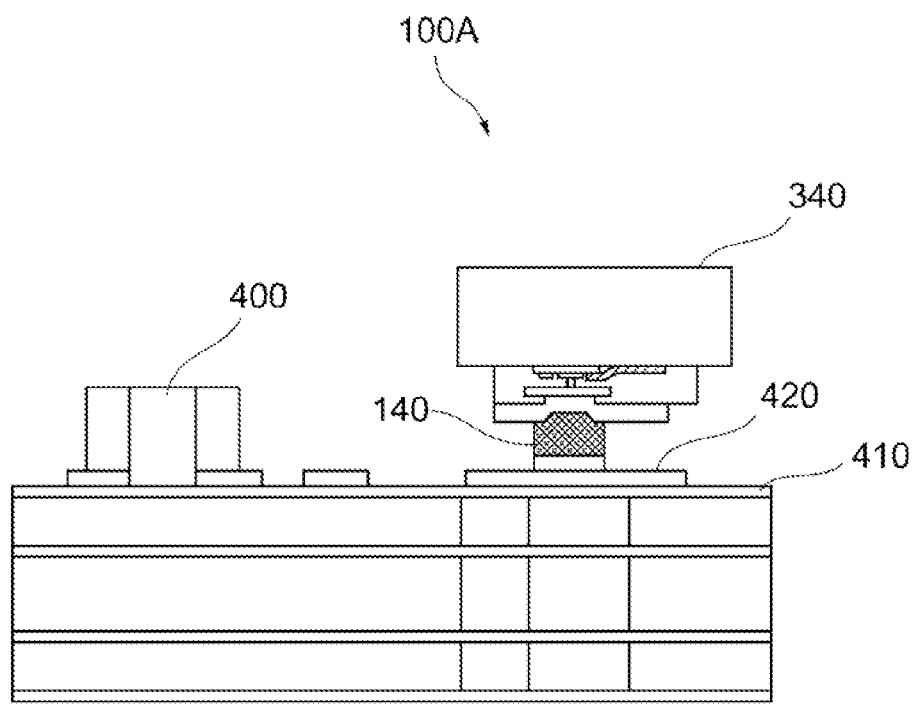
FIG. 4 illustrates an example in which the compound semiconductor device is flip-chip mounted.

FIG. 2 is a circuit diagram of a cell forming the compound semiconductor device 100A. FIG. 3 is a sectional view of the compound semiconductor device 100A taken along line 3-3 of FIG. 1. FIG. 4 illustrates an example in which the compound semiconductor device 100A is flip-chip mounted. An example of the configuration of the compound semiconductor device 100A will be described below with reference to FIGS. 1 through 4.

As shown in FIG. 1, the compound semiconductor device 100A includes a plurality of unit transistors 110. These unit transistors 110 form an HBT. The unit transistors 110 are also called "fingers". In the example shown in FIG. 1, sixteen unit transistors 110 form an HBT. That is, the number of fingers of the HBT is sixteen. However, the number of fingers of the HBT is not restricted to sixteen.

Each unit transistor 110 forms a cell 120, together with a capacitor 111 and a resistor 112. The circuit diagram of the cell 120 is shown in FIG. 2. Each cell 120 amplifies an input RF signal and outputs an amplified RF signal from the collector of the unit transistor 110. A plurality of cells 120 are connected in parallel with each other and form an amplifier which amplifies an RF signal.

The capacitor 111 is formed between an RF input wire 130 into which an RF signal is input and a base wire 131 connected to the base of the unit transistor 110. The capacitor 111 may be formed as a metal-insulator-metal (MIM) capacitor between the RF input wire 130 and the base wire 131. The capacitor 111 blocks DC components of an RF signal and outputs the RF signal. A capacitance depends on a distance between the RF input wire 130 and the base wire 131. For instance, when the distance between the RF input wire 130 and the base wire 131 is shorter, the capacitance increases. When the distance between the RF input wire 130 and the base wire 131 is greater, the capacitance decreases.

The resistor 112 is connected at one end to a bias control wire 132 and at the other end to the base wire 131. Bias is applied to the base of the unit transistor 110 via this resistor 112.

The base of the unit transistor 110 is connected to the base wire 131. The collector of the unit transistor 110 is connected to a collector wire 133. The emitter of the unit transistor 110 is connected to an emitter wire 134. As shown in FIG. 1, the emitter wire 134 is connected to a bump 140. The bump 140 is grounded, so that the emitter of the unit transistor 110 is also grounded.

The sectional structure of the unit transistor 110 will be discussed below with reference to FIG. 3. The unit transistor 110 includes a sub-collector 300, a collector 310, a collector electrode 311, a base 320, a base electrode 321, an emitter 330, and an emitter electrode 331.

The sub-collector 300 is formed on, for example, a gallium arsenide (GaAs) substrate 340. The collector 310 and the collector electrode 311 are formed on the sub-collector 300. The base 320 is formed on the collector 310. The base electrode 321 is formed on the base 320.

As shown in FIG. 3, the collector 310 is electrically connected to the collector wire 133 via the sub-collector 300 and the collector electrode 311. The base 320 is electrically connected to the base wire 131 via the base electrode 321. The emitter 330 is electrically connected to the bump 140 via the emitter electrode 331 and emitter wires 134 and 332. As shown in FIG. 3, the bump 140 is formed above the emitter 330.

As shown in FIG. 4, the compound semiconductor device 100A is mounted on a module substrate 410, together with a surface mount device (SMD) 400, for example. The compound semiconductor device 100A is mounted on the module substrate 410 with the bump 140 facing down the module substrate 410. The bump 140 is connected to a ground surface 420.

The positional relationship between the unit transistors 110 and the bump 140 in the compound semiconductor device 100A will be discussed below. As shown in FIG. 1, the multiple unit transistors 110 are arranged in the x-axis direction (first direction) shown in FIG. 1. The bump 140 is formed over the emitters 330 of the multiple unit transistors 110 and extends in the x-axis direction. As viewed from the bump 140, the emitter 330 of each unit transistor 110 is at least partially covered by the bump 140. The emitters 330 of the multiple unit transistors 110 are displaced from a center line 150 of the bump 140 alternately toward one side (first side), for example, the +y side, and the other side (second side), for example, the −y side, in the y-axis direction (second direction) shown in FIG. 1. That is, the plurality of unit transistors include a first unit transistor and a second unit transistor. The emitter of the first unit transistor is disposed on a first side (for example, the +y side,) of a second direction with respect to a center line of the bump extending in the first direction, and the emitter of the second unit transistor is disposed on a second side (for example, the −y side) of the second direction with respect to the center line of the bump.

With this arrangement, the positions of heat sources (emitters 330) can be distributed more separately than a case in which the emitters 330 of all the unit transistors 110 are linearly arranged along the center line 150 of the bump 140. This makes it possible to reduce the thermal resistance in the compound semiconductor device 100A.

As shown in FIG. 1, in the compound semiconductor device 100A, part of the emitter 330 of each unit transistor 110 is not covered by the bump 140. With this configuration, stress to be applied to the emitters 330 can be reduced compared with a case in which the emitters 330 are entirely covered by the bump 140, thereby making it possible to prolong the life of the unit transistors 110.

A capacitance of the capacitor 111 connected to the first unit transistor may be different from a capacitance of the capacitor 111 connected to the second unit transistor. A capacitance of the capacitor 111 connected to the first unit transistor may substantially be the same as a capacitance of the capacitor 111 connected to the second unit transistor.

As shown in FIG. 1, the length of the base wire 131, which is from the capacitor 111 to the base of the unit transistor 110, connected to the first unit transistor is different from the length of the base wire 131, which is from the capacitor 111 to the base of the unit transistor 110, connected to the second unit transistor. Specifically, the length of the base wire 131 connected to the first unit transistor is shorter than the length of the base wire 131 connected to the second unit transistor.

The base wire 131 includes an inductance component. The base wire 131 with the inductance component and the capacitor 111 with a capacitance component function as an impedance matching circuit to match an impedance between an input side (that is, the base side) and an output side (that is, the collector side) of the unit transistor 110. Hereinafter, both the inductance component of the base wire 131 and the capacitance component of the capacitor 111 may also be referred to as a matching circuit.

A series resonance circuit is formed of the inductance component of the base wire 131 and the capacitance component of capacitor 111 connected to the unit transistor 110. A resonance frequency is determined by the series resonance circuit including the inductance component and the capacitance component. For example, when the length of the base wire 131 connected to the first unit transistor is shorter than the length of the base wire 131 connected to the second unit transistor and the capacitance of the capacitor 111 connected to the first unit transistor is larger than the capacitance of the capacitor 111 connected to the second unit transistor, a matching between a resonance frequency of the matching circuit connected to the first unit transistor and a resonance frequency of the matching circuit connected to the second transistor can be realized. As a result, loss due to an inconsistency of impedance at a certain frequency is reduced.

For example, the number of the unit transistor used depends on a power mode of a power amplifier. Generally, all the unit transistors 110 are used in a high-power mode, and some of the unit transistors 110 are used in a low-power mode. An impedance matching condition in the high-power mode is different from an impedance matching condition in the low-power mode. When the length of the base wire 131 connected to the first unit transistor is shorter than the length of the base wire 131 connected to the second unit transistor and the capacitance of the capacitor 111 connected to the first unit transistor is smaller than the capacitance of the capacitor 111 connected to the second unit transistor, an impedance matching condition of the matching circuit connected to the first unit transistor is different from an impedance matching condition of the matching circuit connected to the second unit transistor. As a result, an appropriate matching condition is achieved both in the high-power mode and the low-power mode.

For example, when the length of the base wire 131 connected to the first unit transistor is shorter than the length of the base wire 131 connected to the second unit transistor and the capacitance of the capacitor 111 connected to the first unit transistor is substantially the same as the capacitance of the capacitor 111 connected to the second unit transistor, an impedance of the matching circuit connected to the first unit transistor and an impedance of the matching circuit connected to the second transistor are substantially constant. As a result, a stable impedance matching condition is maintained in all the unit transistors.

A description will now be given below, with reference to FIGS. 5A through 6, how the thermal resistance changes according to the positional relationship between the bump 140 and the emitters 330.

Figure 5A:
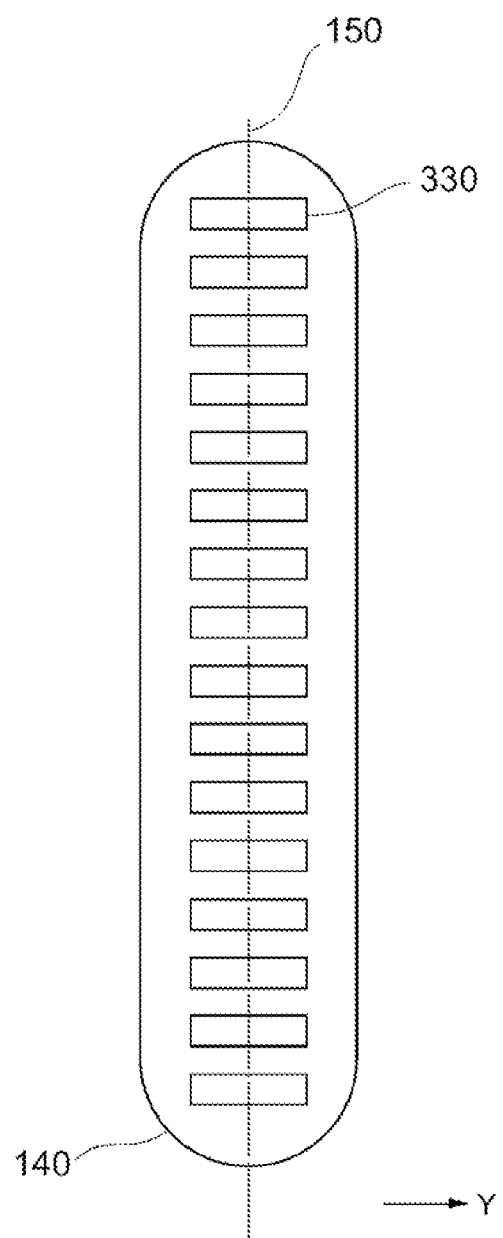
FIG. 5A illustrates an example in which emitters are linearly arranged on the center line of a bump (linear arrangement).
Figure 5B:
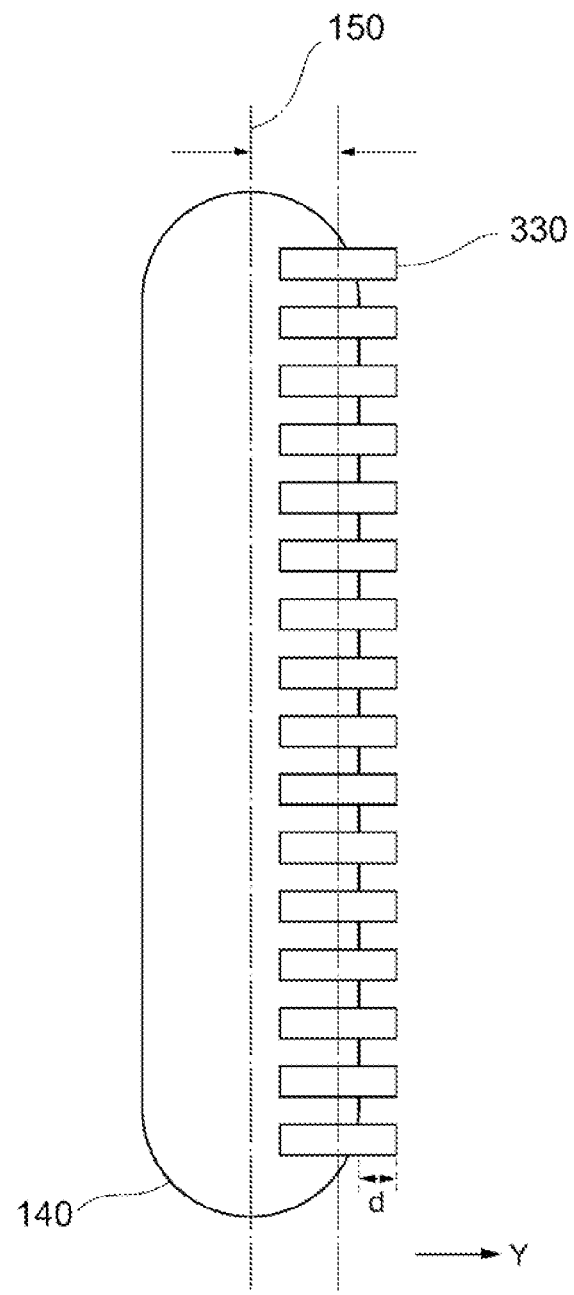
FIG. 5B illustrates an example in which emitters are displaced from the center line of a bump toward one side (+y side) (linear arrangement).
Figure 5C:
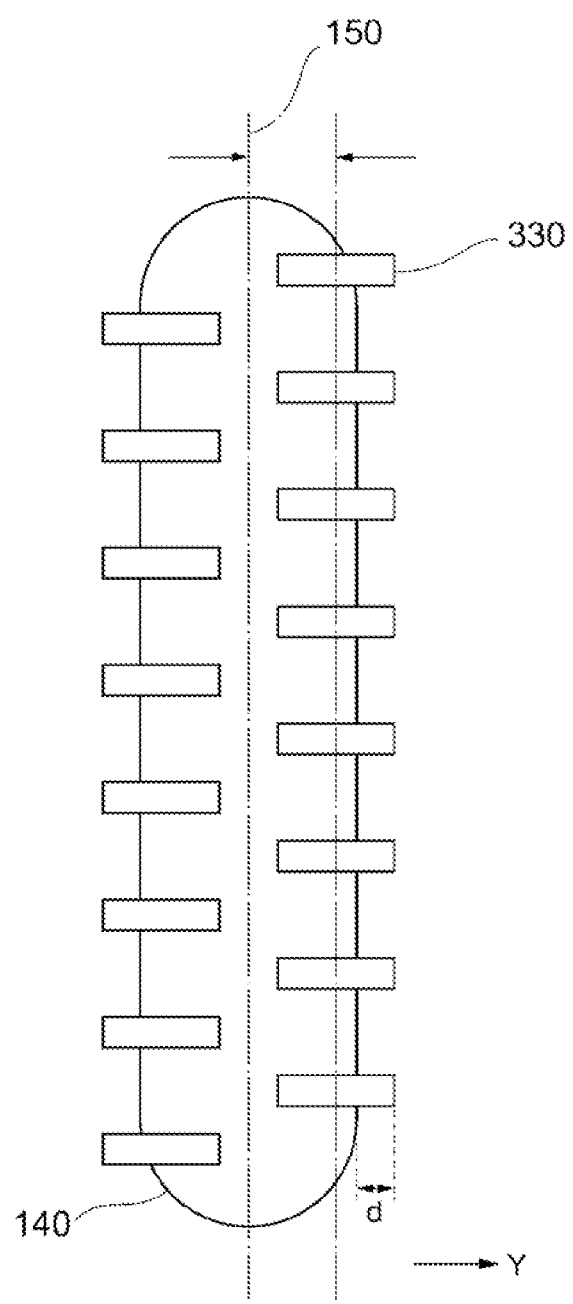
FIG. 5C illustrates an example in which emitters are displaced from the center line of a bump alternately toward one side (+y side) and the other side (−y side).

FIG. 5A illustrates an example in which the emitters 330 are linearly arranged on the center line 150 of the bump 140 (linear arrangement). FIG. 5B illustrates an example in which the emitters 330 are displaced from the center line 150 of the bump 140 toward one side (+y side) (linear arrangement). FIG. 5C illustrates an example in which the emitters 330 are displaced from the center line 150 of the bump 140 alternately toward one side (+y side) and the other side (−y side), as in the compound semiconductor device 100A.

Figure 6:
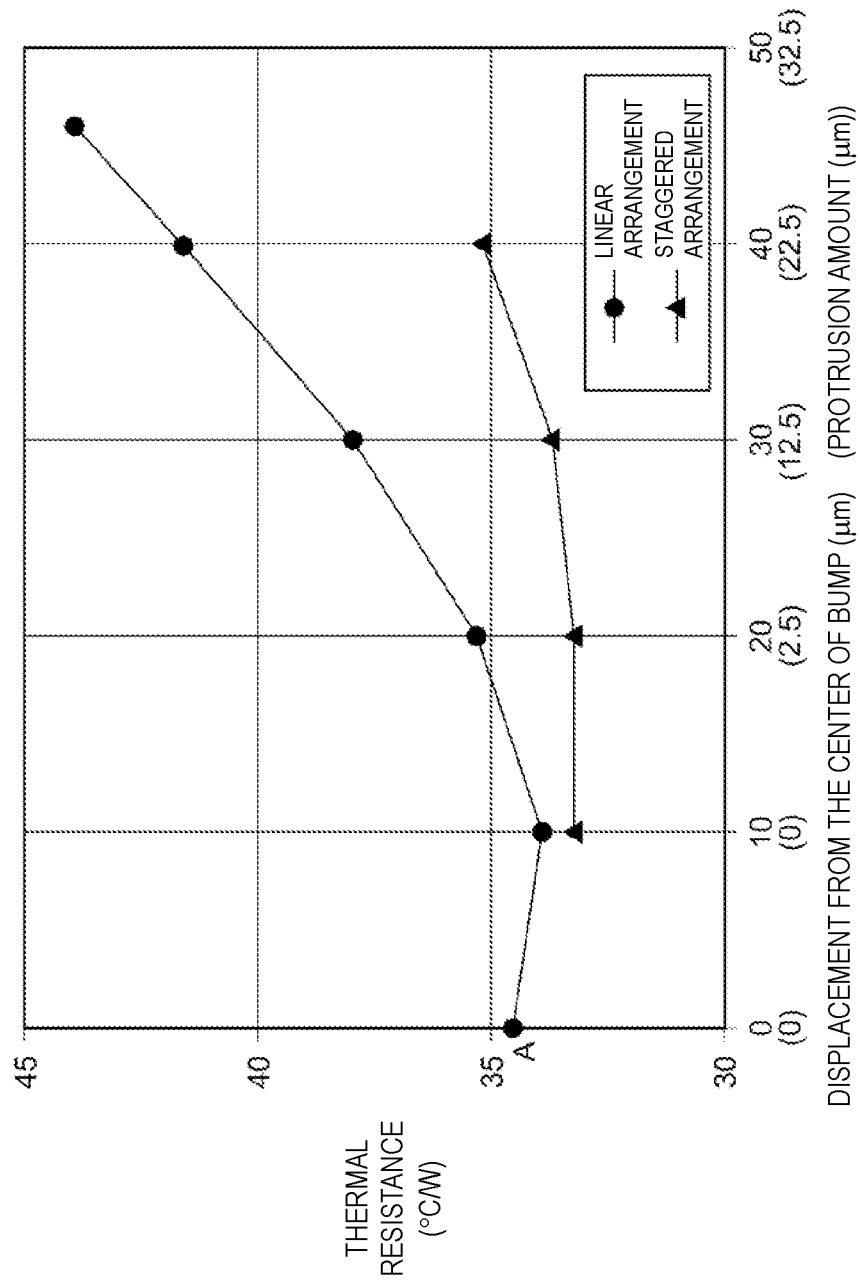
FIG. 6 is a graph illustrating simulation results indicating how the thermal resistance changes according to the amount by which emitters are displaced from the center line of a bump.

FIG. 6 is a graph illustrating simulation results indicating how the thermal resistance changes according to the amount by which the emitters 330 are displaced from the center line 150 of the bump 140 (hereinafter such an amount will simply be called a displacement). In FIG. 6, the horizontal axis indicates the displacement (distance) (μm) between the center of the emitter 330 and the center line 150 of the bump 140, while the vertical axis indicates the thermal resistance (° C./W). In FIG. 6, the line represented by the solid circles (linear arrangement) corresponds to the arrangements shown in FIGS. 5A and 5B, and the line represented by the solid triangles (staggered arrangement) corresponds to the arrangement shown in FIG. 5C.

The simulations were carried out under the following conditions: the dimension of the bump 140 in the y-axis direction was about 75 μm, and the dimension of the emitters 330 in the y-axis direction was about 40 μm; and the displacement of the emitters 330 was varied to about 0 μm, 10 μm, 20 μm, 30 μm, 40 μm, and 50 μm.

When the displacement of the emitters 330 is about 0 μm, 10 μm, 20 μm, 30 μm, 40 μm, and 50 μm, the amount by which the emitters 330 protrude from the edge of the bump 140 (protrusion amount d) is about 0 μm, 0 μm, 2.5 μm, 12.5 μm, 22.5 μm, and 32.5 μm, respectively.

As shown in FIG. 6, in the case of the linear arrangement, when the displacement of the emitters 330 is increased, as in FIG. 5B, to about 10 μm, the thermal resistance becomes slightly smaller than that in a case in which the emitters 330 are not displaced at all (point A in FIG. 6). However, as the displacement of the emitters 330 is further increased, the thermal resistance becomes higher.

In contrast, as shown in FIG. 6, in the case of the staggered arrangement, when the displacement of the emitters 330 is about 10 μm, 20 μm, and 30 μm, the thermal resistance is smaller than that in a case in which the emitters 330 are not displaced at all (point A in FIG. 6).

The above-described simulation results show that, by displacing the emitters 330 from the center line 150 of the bump 140 toward one side (+y side) and the other side (−y side), it is possible to reduce the thermal resistance to a smaller level than that in a case in which the emitters 330 are not displaced at all (point A).

The above-described simulation results also show that, in the case of the staggered arrangement, when the protrusion amount d of the emitters 330 is about 2.5 μm (displacement of 20 μm) and about 12.5 μm (displacement of 30 μm), it is possible to reduce the thermal resistance to a smaller level than that in a case in which the emitters 330 are not displaced at all (point A). That is, in the case of the staggered arrangement, when part of the emitter 330 of each unit transistor 110 is not covered by the bump 140, a decrease in the thermal resistance is also implemented. In this configuration, stress to be applied to the emitters 330 is reduced compared with a case in which the emitters 330 are entirely covered by the bump 140, thereby making it possible to prolong the life of the unit transistors 110.

Modified examples of the compound semiconductor device 100A will now be described below. In the following modified examples, the same elements as those of the compound semiconductor device 100A are designated by like reference numerals, and an explanation thereof will thus be omitted.

Figure 7:
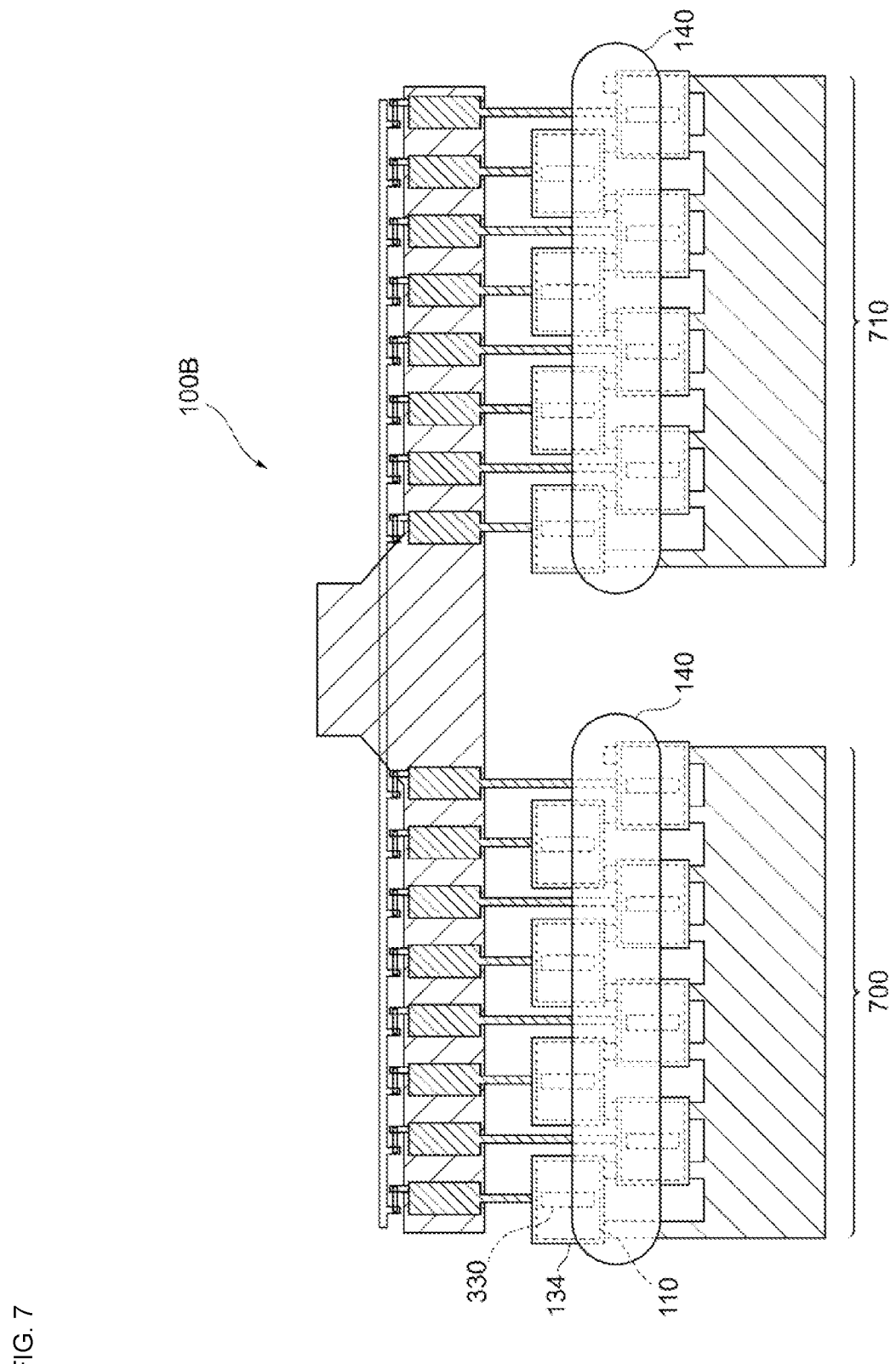
FIG. 7 is a plan view of a compound semiconductor device according to another embodiment of the disclosure.

FIG. 7 is a plan view of a compound semiconductor device 100B according to an embodiment of the disclosure. In the compound semiconductor device 100B, a plurality of unit transistors 110 are grouped into multiple blocks, and a bump 140 is provided for each block. More specifically, eight unit transistors 110 form a block 700 and the other eight unit transistors form another block 710.

Figure 8:
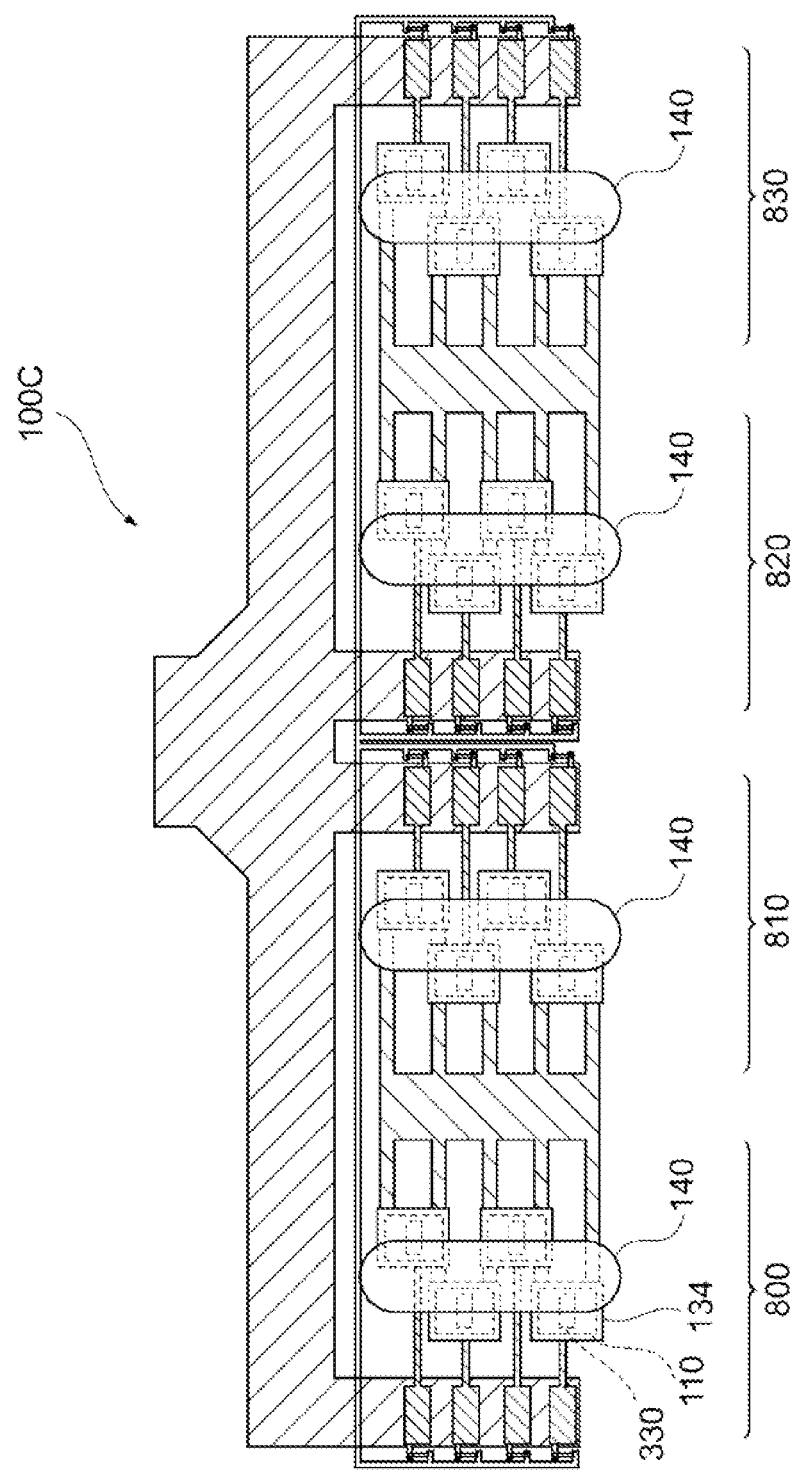
FIG. 8 is a plan view of a compound semiconductor device according to another embodiment of the disclosure.

FIG. 8 is a plan view of a compound semiconductor device 100C according to an embodiment of the disclosure. In the compound semiconductor device 100C, as well as the compound semiconductor device 100B, a plurality of unit transistors 110 are grouped into multiple blocks, and a bump 140 is provided for each block. More specifically, four unit transistors 110 form each of blocks 800, 810, 820, and 830.

Figure 9:
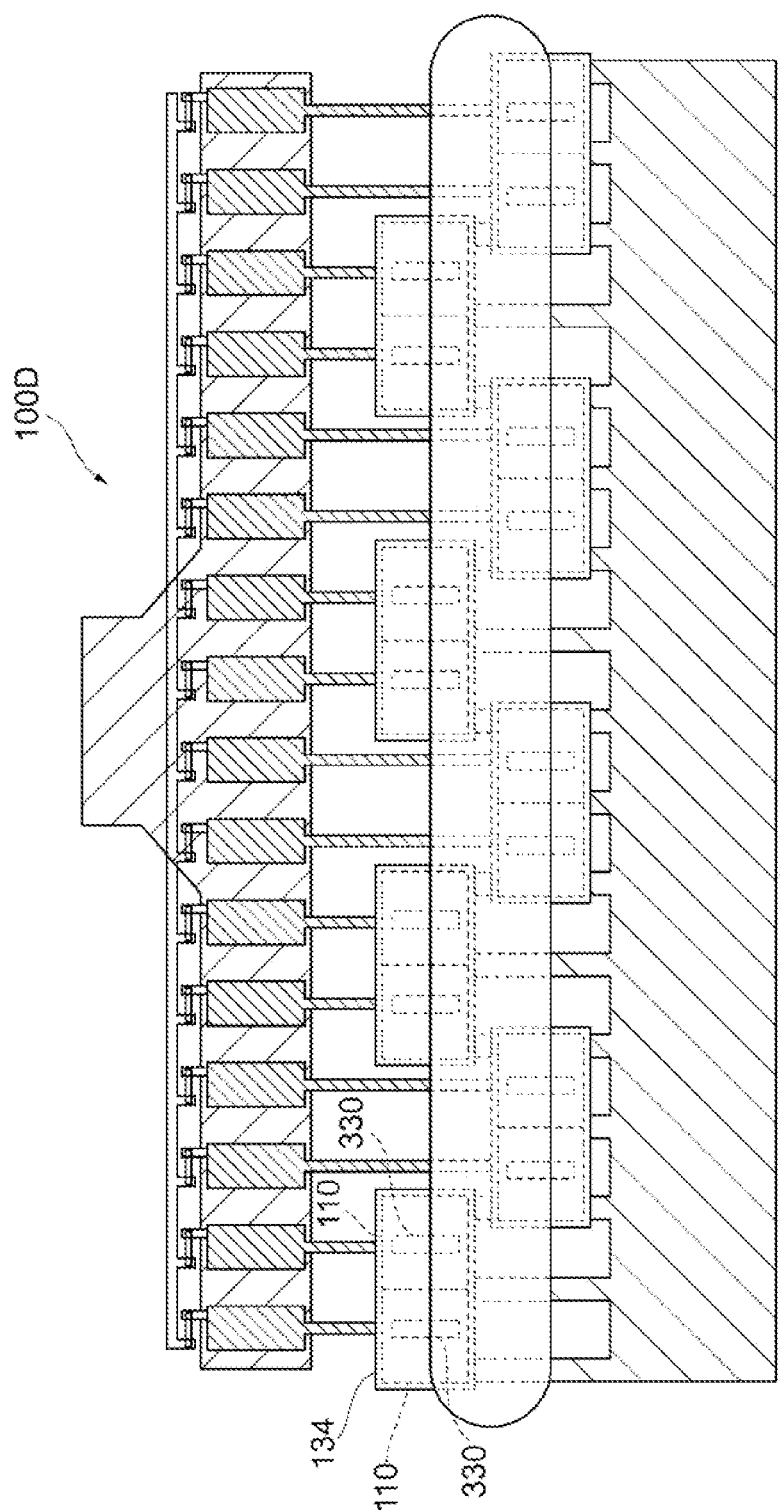
FIG. 9 is a plan view of a compound semiconductor device according to another embodiment of the disclosure.

FIG. 9 is a plan view of a compound semiconductor device 100D according to an embodiment of the disclosure. In the compound semiconductor device 100D, a plurality of unit transistors 110 are displaced from the center line of the bump alternately by the group of two unit transistors 110. In this manner, instead of being displaced alternately one by one, the emitters 330 of the unit transistors 110 may be displaced alternately by the group of multiple unit transistors 110. In the example shown in FIG. 9, two unit transistors 110 are formed into each group, but three or more unit transistors 110 may be formed into each group.

In the configurations of the compound semiconductor devices 100B through 100D shown in FIGS. 7 through 9, by displacing the emitters 330 of the unit transistors 110 from the center line 150 of the bump 140, it is possible to reduce the thermal resistance, as in the compound semiconductor device 100A.

Figure 10:
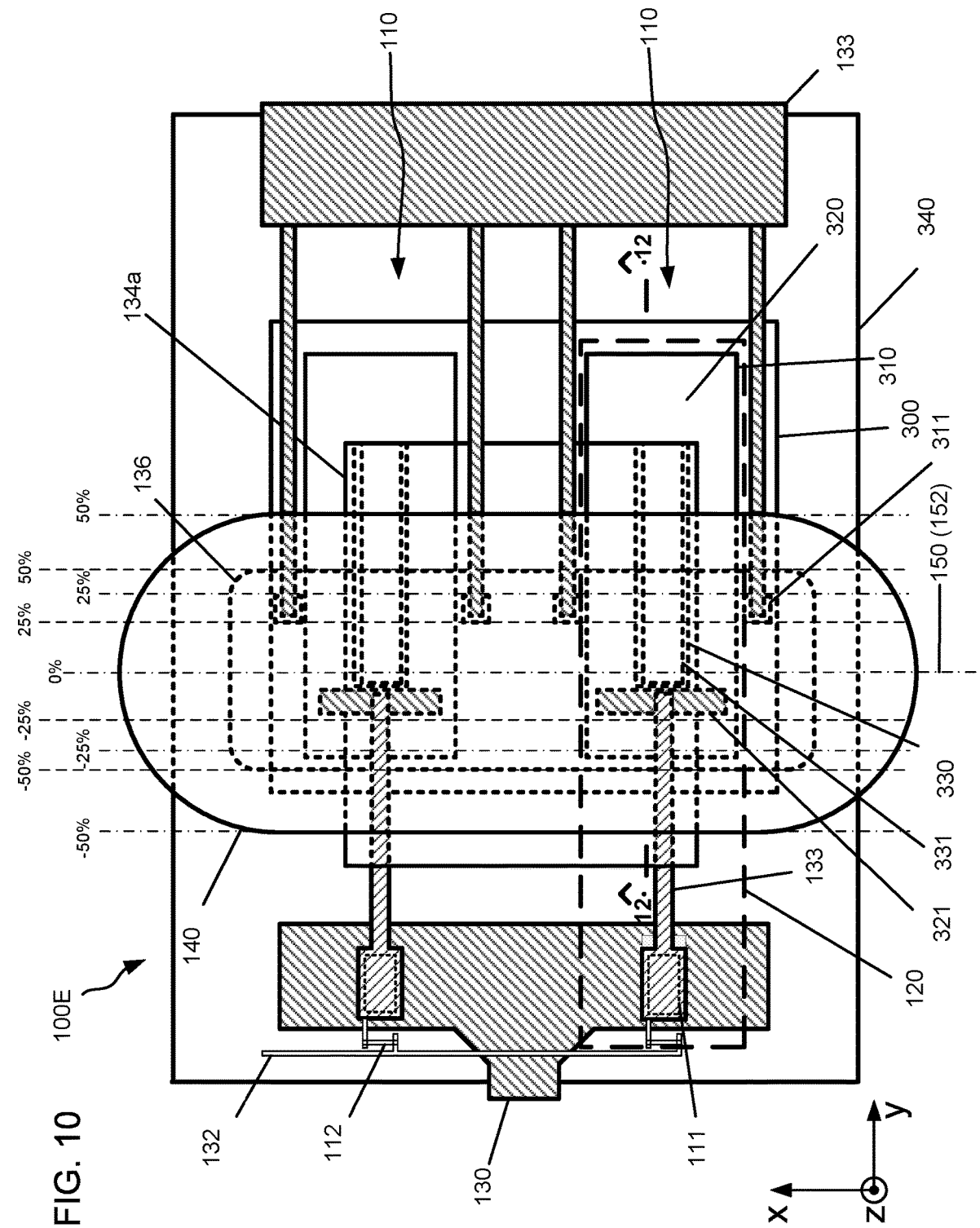
FIG. 10 is a plan view of a semiconductor device according to another embodiment of the disclosure.
Figure 11:
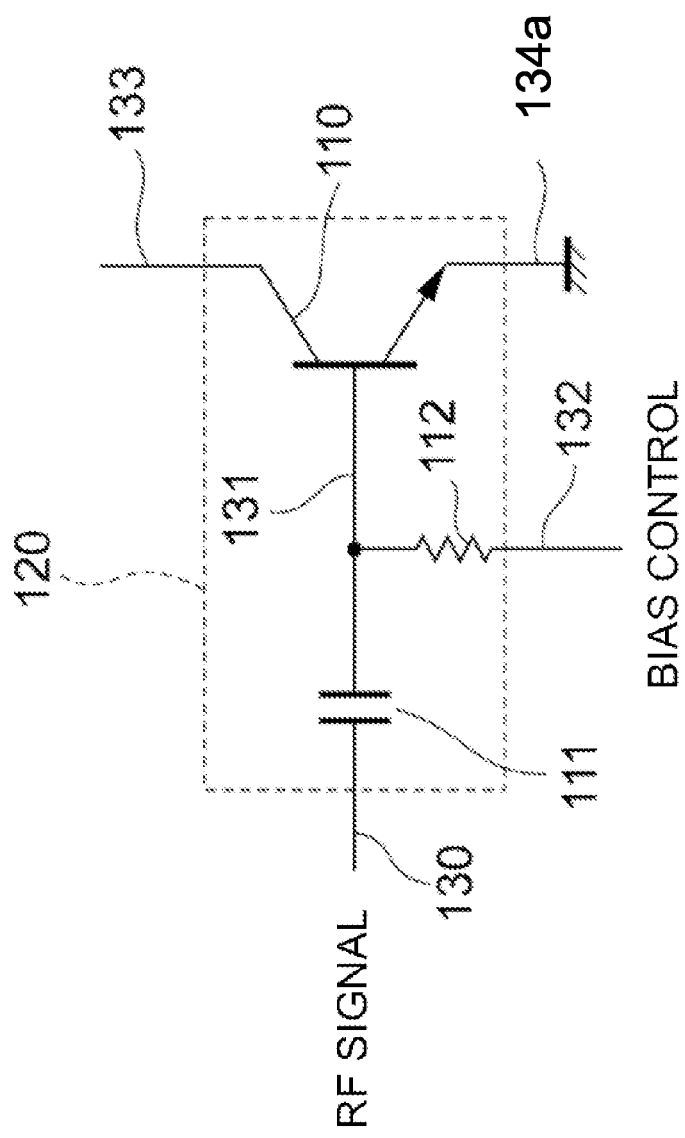
FIG. 11 is a circuit diagram of a cell forming the compound semiconductor device shown in FIG. 10.
Figure 12:
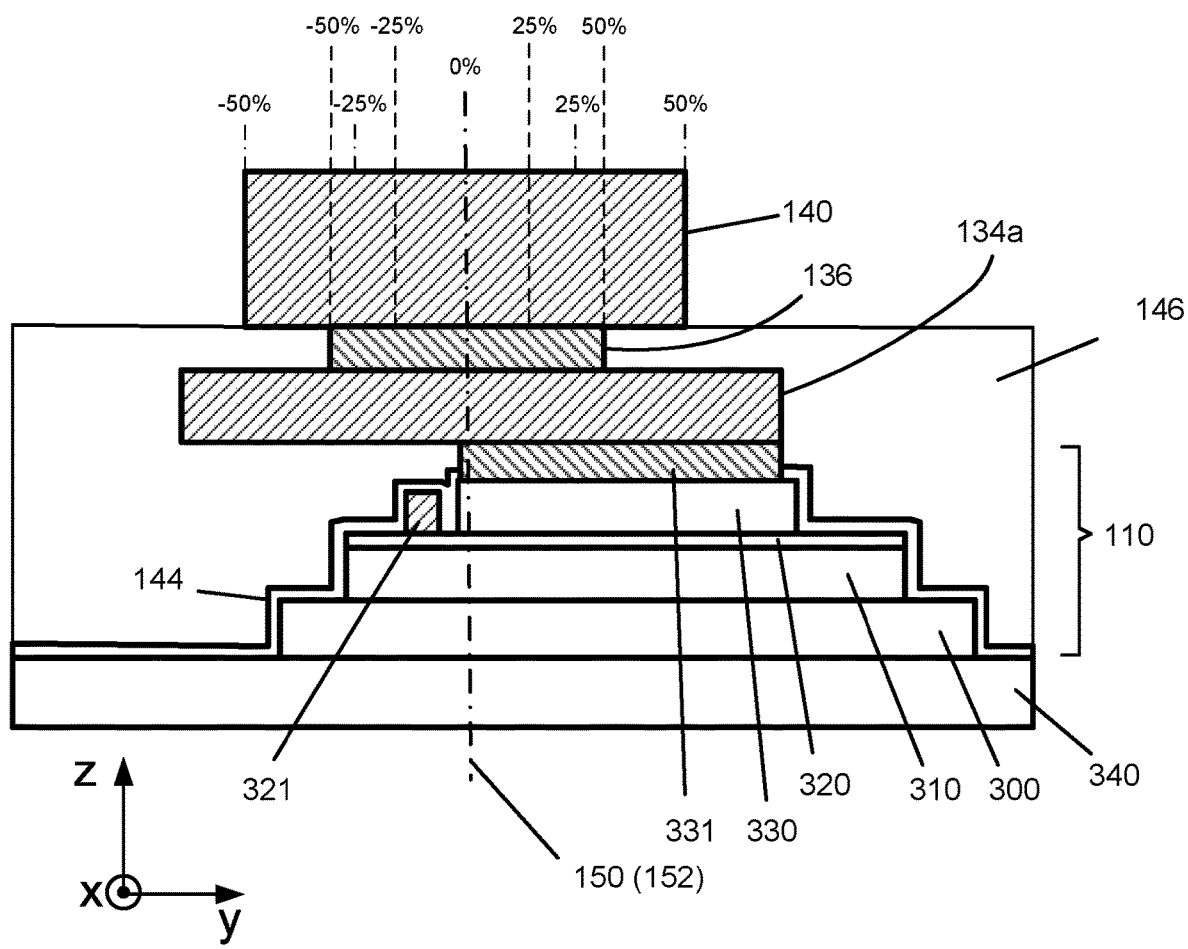
FIG. 12 is a sectional view of the compound semiconductor device taken along line 12-12 of FIG. 10.

FIG. 10 is a plan view of a semiconductor device 100E according to an exemplary embodiment. FIG. 11 is a circuit diagram of a cell forming the semiconductor device 100E. FIG. 12 is a sectional view of the semiconductor device 100E taken along line 12-12 of FIG. 10. FIGS. 4A to 6 illustrate how to determine size and position of elements of the semiconductor device 100 to achieve optimal cooling of a cell. FIG. 7 illustrates an example in which the semiconductor device 100E is flip-chip mounted. An example of the configuration of the semiconductor device 100E will be described below with reference to FIGS. 10 through 17A.

As shown in FIG. 10, the semiconductor device 100E includes a plurality of unit transistors 110. Each unit transistor 110 is provided on a substrate 340 and includes a sub-collector 300, collector 310, collector electrode 311, base 320, base electrode 321, emitter 330, and emitter electrode 331 forming an HBT. As noted earlier, these unit transistors 110 are also called "fingers." In the example shown in FIG. 10, only two unit transistors 110 are shown connected in parallel to form an HBT having two fingers. However, the number of fingers of the HBT is not restricted to only two.

Each unit transistor 110 forms a cell 120, together with a capacitor 111 and a resistor 112. The circuit diagram of the cell 120 is shown in FIG. 11. Each cell 120 amplifies an input RF signal and outputs an amplified RF signal from the collector 310 of the unit transistor 110. The plurality of cells 120 connected in parallel with each other form an amplifier which amplifies an RF signal.

The capacitor 111 is formed between an RF input wire 130 into which an RF signal is input and a base wire 131 connected to the base electrode 321 of the unit transistor 110. The capacitor 111 may be formed as a MIM capacitor between the RF input wire 130 and the base wire 131. The capacitor 111 blocks DC components of an RF signal and outputs the RF signal.

The resistor 112 is connected at one end to a bias control wire 132 and at the other end to the base wire 131. Bias is applied to a base 320 of the unit transistor 110 via the resistor 112.

The base 320 of the unit transistor 110 includes the base electrode 321, which is connected to the base wire 131. The collector 310 of the unit transistor 110 is connected to a collector wire 133 through the sub-collector 300 and collector electrode 311. The emitter 330 of the unit transistor 110 is connected to a metal 2 layer 134a through the emitter electrode 331. As shown in FIGS. 10 and 12, the metal 2 layer 134a connects to the bump 140 through a conductor filled via opening 136 and connects the emitter electrodes of the unit transistors to one another. The bump 140 is grounded, so that the emitter 330 of the unit transistor 110 is also grounded.

The sectional structure of the unit transistor 110 will be discussed below with reference to FIG. 12. The unit transistor 110 includes the sub-collector 300, the collector 310, the collector electrode 311 (see FIG. 10), the base 320, the base electrode 321, the emitter 330, and the emitter electrode 331. The emitter 330 forms a heterojunction with the base 320 and has a wider bandgap than the base.

The sub-collector 300 is formed on, for example, a gallium arsenide (GaAs) substrate 340. The collector 310 and the collector electrode 311 are formed on the sub-collector 300. The base 320 is formed on the collector 310. The base electrode 321 is formed on the base 320.

At least one passivation layer 144 is provided on the semiconductor layers of the unit transistor 110 and the base electrode 321. A dielectric layer 146 covers the passivation layer(s) and the metal 2 layer 134a. The via opening is formed in the dielectric layer 146 to expose the metal 2 layer 134a, and is filled with an electrically conductive material to form the conductor filled via opening.

As shown in FIG. 12, the bump 140 is formed above the emitter 330 on the dielectric layer 146 and is electrically connected to the emitter 330 via the emitter electrode 331, the metal 2 layer 134a, and the conductor filled via opening 136.

Similar to the flip chip mounting structure shown in FIG. 4, the semiconductor device 100E can be mounted on a module substrate, together with an SMD, for example, with the bump 140 facing downward toward the module substrate.

As shown in FIGS. 10 and 12, the semiconductor device 100E reduces heat resistance in an HBT cell 120 by satisfying two conditions related to sizing and positioning the via opening relative to the bump 140, and positioning the base electrode 321 in proximity of the center line 150 of the conductor filled via opening 136. These two conditions for optimal cooling of the HBT cell 120 are now described.

Figure 13A:
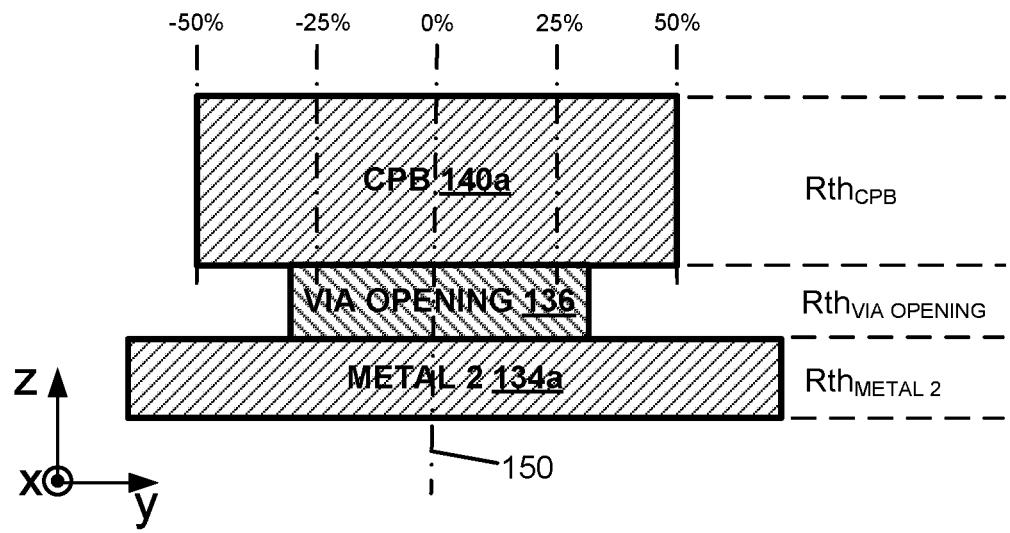
FIG. 13A is a diagram illustrating an amount of overlap of a via opening by a bump satisfying a first condition for reduction of thermal resistance.
Figure 13B:
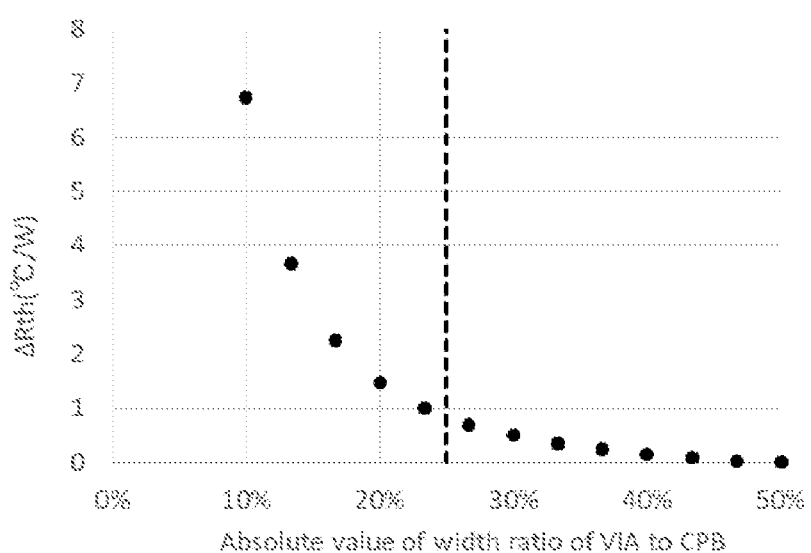
FIG. 13B is a graph illustrating simulation results indicating how the thermal resistance changes according to a change in with ratio of via opening width to bump width.

The first condition for reducing heat resistance in an HBT cell 120, sometimes referred to herein as "the first condition," is illustrated by FIGS. 13A and 13B. FIG. 13A shows the structure of one of the unit transistors 110 of the semiconductor device 100 above the emitter electrode 331, which includes a 75 µm wide bump, which is depicted here as a CPB 140a, a conductor filled via opening 136 that is 2 µm thick in the z-axis direction, and the metal 2 layer 134a. The total heat resistance of this structure is the sum of the heat resistance of each of the depicted components. That is, Rthtotal is the sum of the heat resistance of the CPB 140a, RthCPB, the heat resistance of the via opening 136, RthVIA OPENING, and the heat resistance of the metal 2 layer 134a, RthMETAL 2.

FIG. 13B shows simulation results of heat resistance, which were calculated while maintaining a common center of the CPB 140a and the via opening 136, and changing a width of the via opening 136. The simulation results of FIG. 13B show that total heat resistance Rthtotal becomes small with an absolute value of width ratio of the via opening width to bump width overlap of at least about 25 percent.

In FIG. 13B, the width ratio of VIA to CPB is calculated as an absolute value. That is, 50 percent of the absolute value of the width ratio of VIA to CPB means that the via opening equals to the width of the CPB, and 25 percent of the absolute value of the width ratio of VIA to CPB means that the width of the via opening is half the width of the CPB.

The results of FIG. 13B show that for optimal reduction in heat resistance, the sizing of the conductor filled via opening 136 should have a dimension of width covering at least −25 percent of the CPB width in the negative y-axis direction from the center of the CPB 140a (at 0 percent) and covering at least 25 percent of the CPB width in the positive y-axis direction from the center of the CPB 140a, for example, as shown in FIG. 13A. Equivalently, optimal reduction in heat resistance can be obtained with the via opening 136 covering between −25 percent and 25 percent of the bump 140 when a line drawn in the center of the CPB 140a in the width direction is defined as 0 percent, one edge of the CPB 140a in the width direction is defined as 50 percent, and another edge of the bump in the width direction is defined as −50 percent.

Figure 14A:
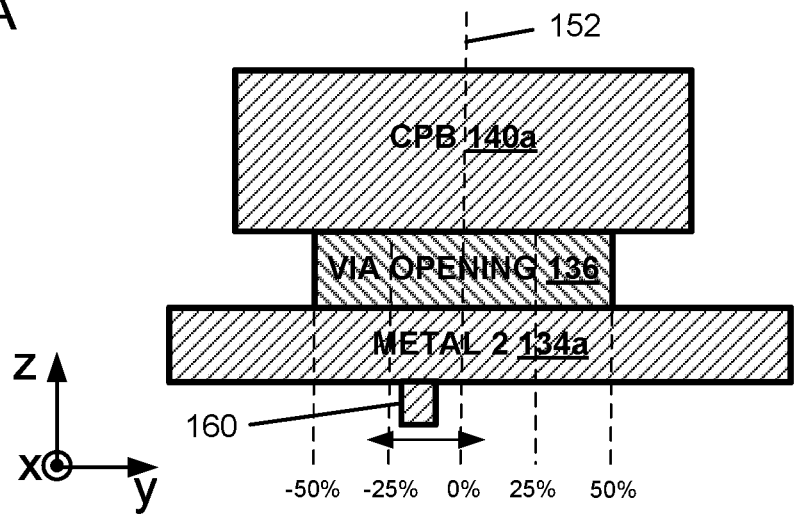
FIG. 14A illustrates the simulation conditions of upper metallization structure on a unit transistor.
Figure 14B:
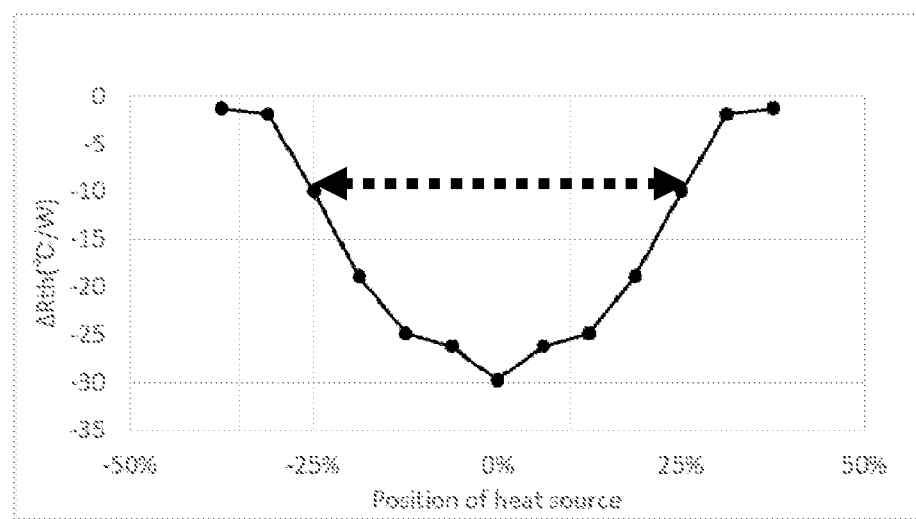
FIG. 14B is a graph illustrating the simulated conditions of the upper metallization and a preferred placement region of a heat source relative to a via opening.

The second condition for optimal reduction of heat resistance in the HBT cell 120, sometimes referred to herein as "the second condition," is illustrated by FIGS. 14A and 14B, where heat resistance is calculated with variation of position of a heat source 160 in a width direction along the y-axis. More particularly, as illustrated in FIG. 14A, heat resistance was calculated for metallization layers over a unit transistor 110 by a simulation which changed the position of the heat source 160 in the directions of the arrows along the width of the bump, which is depicted here as a CPB 140a, while the size and position of the CPB 140a and the via opening 136 were fixed. In the simulation, CPB 140a had a width of 75 µm and via opening 136 had a width of 50 µm, resulting in a ratio of a via opening width to bump width of 0.67.

FIG. 14B illustrates simulation results of heat resistance calculated while changing the position of the heat source 160. The heat source 160 represents the region around the base electrode that tends to be the hottest region in the HBC cell 120. These results indicate that a region below the via opening 136 depicted as being from −25 percent on the left side of the center of the via opening to 25 percent on the right side of the center of the via opening, or equivalently, the region covering from −25 percent to 25 percent of the overlying via opening, when a line drawn in the center of the via opening in the width direction is defined as 0 percent, one edge of the via opening in a positive width direction is defined as 50 percent, and another edge of the via opening in a negative width direction is defined as −50 percent, is an optimal region for cooling the heat source 160, and thus also the region of the HBC cell in which to position the entire base electrode 321 for optimal cooling.

Figure 15:
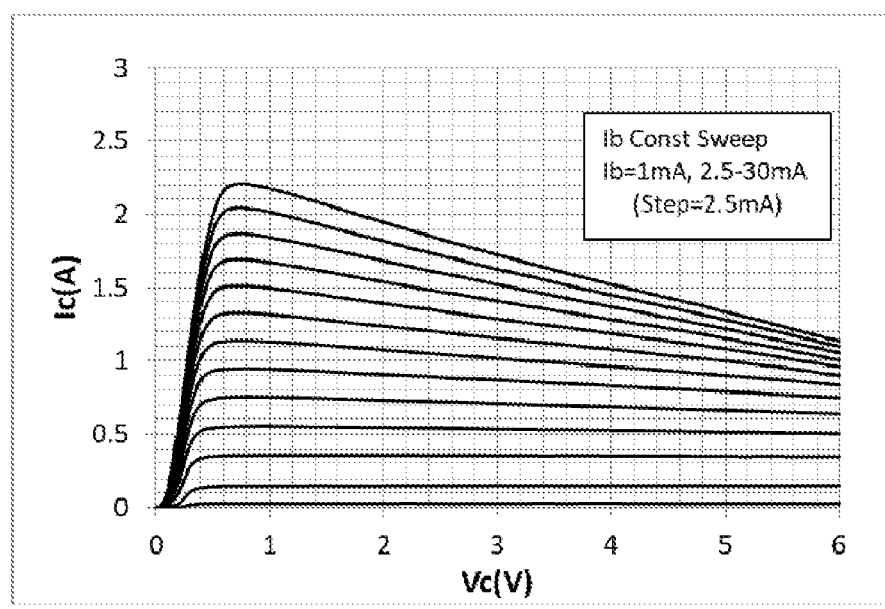
FIG. 15 is a graph of a simulated I-V characteristic of a semiconductor device according to an exemplary embodiment and illustrating removal of collector current collapse.

With the above first and second conditions satisfied, current collapse disappears, as illustrated in FIG. 15.

Figure 16:
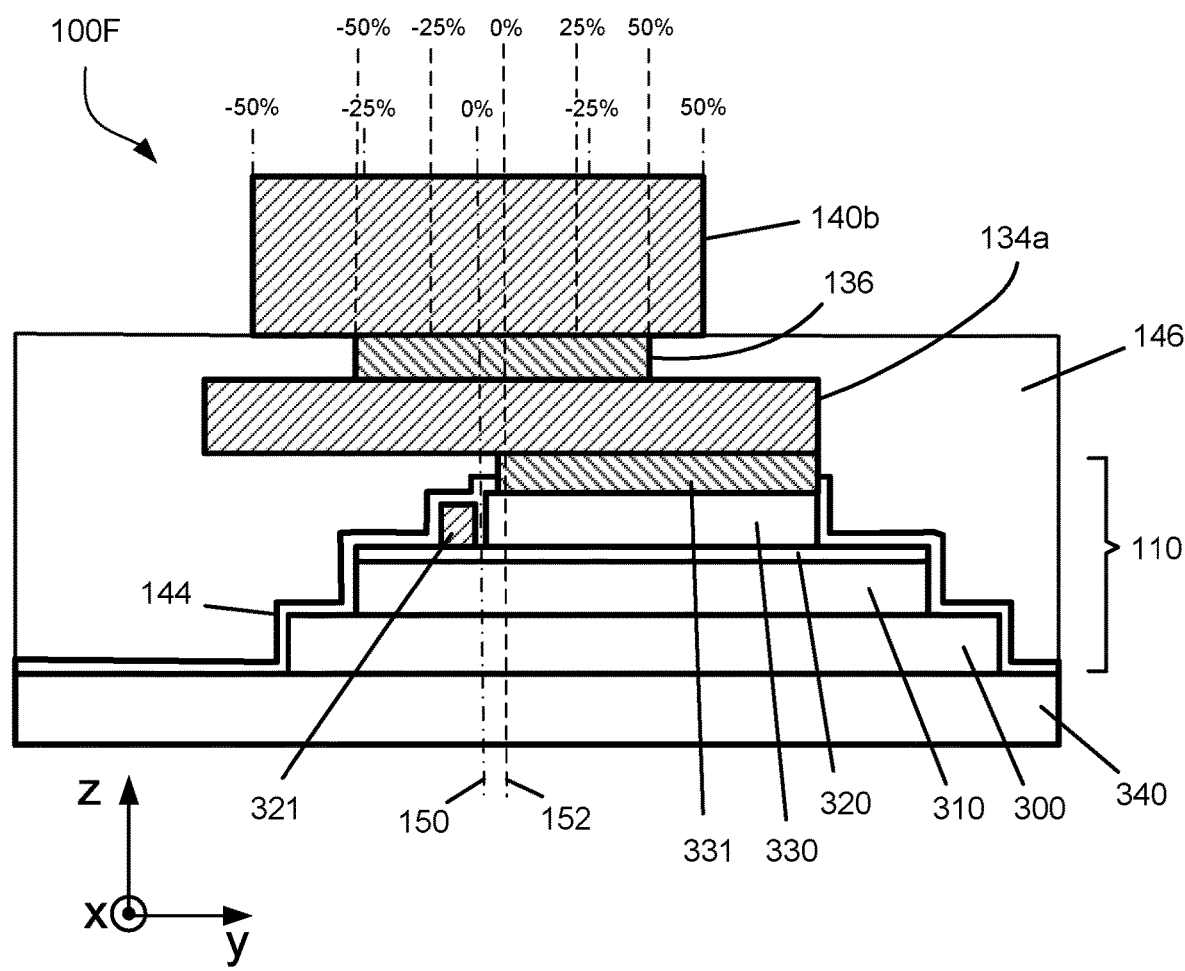
FIG. 16 is a sectional view of a compound semiconductor device according to another embodiment of the disclosure.

FIG. 16 is a sectional view of a semiconductor device 100F according to an another exemplary embodiment. The semiconductor device 100F is different from the semiconductor device 100E in that a center of the bump 140b in a width direction along the y-axis does not coincide with the center of the via opening 136 in the width direction. As shown in FIG. 16, the center line 150 of bump 140b is spaced along the y-axis to one side of a center line 152 of the via opening 136. However, the positioning of the bump 140b relative to the positioning of the via opening 136 and the positioning of entire base electrode 321 relative to the via opening 136 satisfy the two conditions for optimal cooling of the HBT cell 120.

Figure 17A:
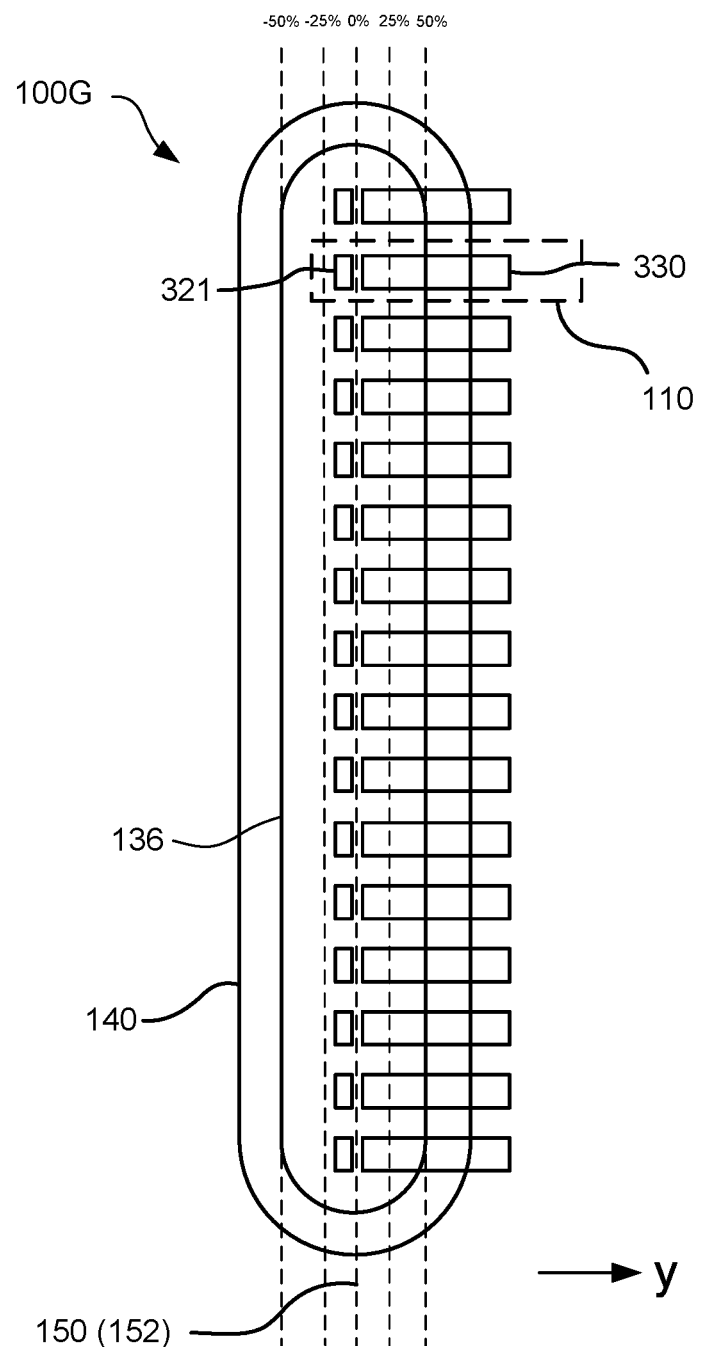
FIG. 17A illustrates an exemplary embodiment in which emitters and base electrodes of a multi-finger embodiment are linearly arranged.

FIG. 17A is a simplified plan view illustrating an exemplary embodiment of a semiconductor device 100G in which the emitters 330 and base electrodes 321 of 16 unit transistors are provided in a linear arrangement displaced from the center line 150 of the bump 140 toward one side (+y-axis side). As shown in FIG. 17A, the center line 150 of the bump 140 coincides in a plan view with the center line 152 of the via opening 136, but in other embodiments the center lines 150 and 152 can be spaced from one another along the y-axis.

The via opening 136 of semiconductor device 100G is positioned to cover portions of the bump 140 such that the first condition is satisfied. Additionally, the base electrodes 321 are positioned within the optimal cooling region such that the second condition is satisfied.

In the case of the linear arrangement of semiconductor device 100G, in addition to the reduction of thermal resistance resulting from the satisfying the first and second conditions, it is possible to also reduce the thermal resistance to a smaller level than that in a case in which the emitters 330 are not displaced at all. That is, when part of the emitter 330 of each unit transistor 110 is not covered by the bump 140, a decrease in the thermal resistance is implemented. In this configuration, stress to be applied to the emitters 330 is reduced compared with a case in which the emitters 330 are entirely covered by the bump 140, thereby making it possible to prolong the life of the unit transistors 110.

FIGS. 17B-17C are simplified plan views respectively illustrating exemplary embodiments of semiconductor devices 100H and 100I in which the emitters 330 are displaced from the center line 150 of the bump 140 alternately toward one side (+y side) and the other side (−y side), in a manner similar to the compound semiconductor device 100A. Here again, the center lines 150 of the bump 140 coincide in a plan view with the center lines 152 of the via opening 136, but in other embodiments the center lines 150 and 152 can be spaced from one another along the y-axis. Additionally, in each of semiconductor devices 100H and 100I, the via opening 136 is positioned to cover sufficient portions of the bump 140 such that the first condition is satisfied.

Each finger of the semiconductor device 100H shown in FIG. 17B has a base electrode 321 positioned to the −y side of the emitter. Base electrodes 321 adjacent to the emitters 330 of fingers displaced from the center line 150 toward +y side are positioned entirely within a region satisfying the second condition, and thus reduce thermal resistance in those fingers.

In FIG. 17C, each finger of the semiconductor device 100I having emitters displaced from the center line 150 of the bump 140 to the +y side has a base electrode 321 positioned to the −y side of the emitter, and each finger of the semiconductor device 100I having emitters displaced from the center line 150 of the bump 140 to the −y side has a base electrode 321 positioned to the +y side of the emitter. In this way, all the base electrodes of the displaced emitters can be positioned such that the second condition is satisfied, and thus thermal resistance can be reduced in all fingers having displaced emitters.

The direction of displacement of unit transistors 110 in each of semiconductor devices 100G through 100I and/or positioning of the base electrodes 321 relative to the emitters 330 can be reversed. For example, semiconductor devices 100G can have base electrodes 321 of unit transistors 110 positioned to the +y side of the respective emitters 330, and the unit transistors 110 can be displaced from the center line 150 of the bump 140 toward the −y side, and semiconductor devices 100H can have base electrodes 321 of unit transistors 110 positioned to the +y side of the respective alternately displaced emitters 330.

Figure 18:
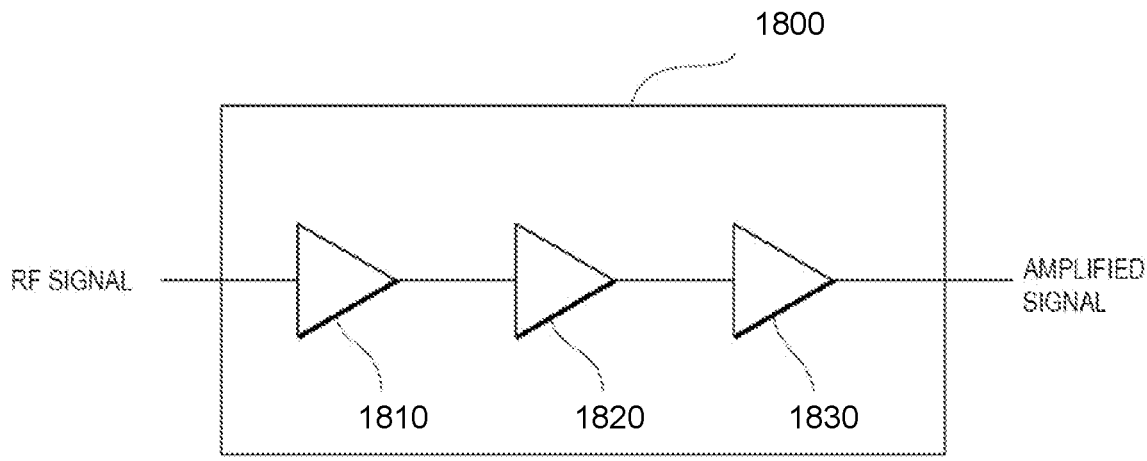
FIG. 18 illustrates the configuration of a power amplifier module according to an embodiment of the disclosure.
Figure 19:
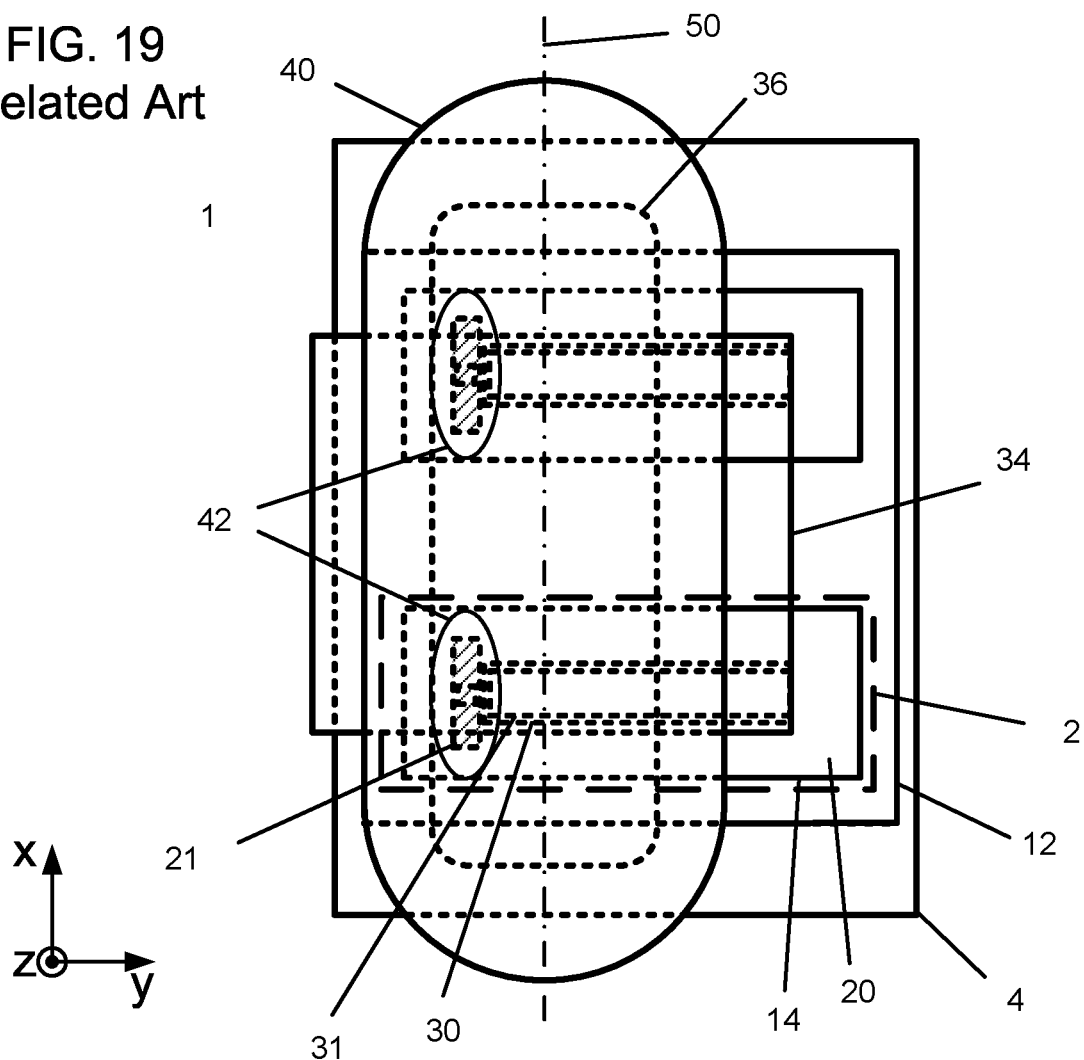
FIG. 19 illustrates a configuration of a related semiconductor device.
Figure 20:
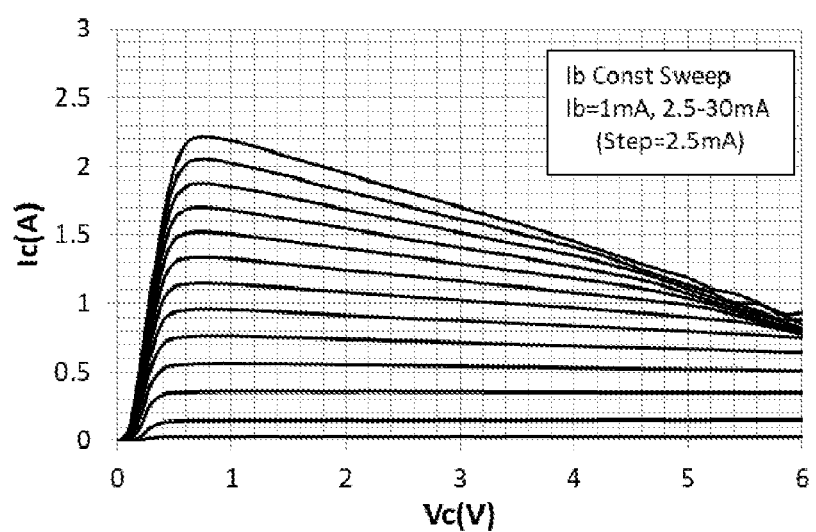
FIG. 20 a graph of a simulated I-V characteristic of a related semiconductor device with collector current collapse.

FIG. 18 illustrates the configuration of a power amplifier module 1800 according to an embodiment of the disclosure. The power amplifier module 1800 includes three stages of amplifiers 1810, 1820, and 1830. Each of the amplifiers 1810, 1820, and 1830 amplifies an input RF signal and outputs the amplified RF signal. In the power amplifier module 1800, any one of the semiconductor devices 100A to 100I is used in, for example, the amplifier 1830 at the final stage, thereby making it possible to reduce the thermal resistance in the amplifier 1830. The semiconductor devices 100A to 100I may be used in the amplifier 1810 or 1820. However, since the current flowing through the amplifier 1830 at the final stage is greater, the effect of reducing the thermal resistance is enhanced if any one of semiconductor devices 100A to 100I is used in the power amplifier module 1800.

The present disclosure has been described through illustration of preferred embodiments. According to the preferred embodiments, the emitter 330 of at least one of multiple unit transistors 110 is arranged such that it is displaced from the center line 150 of the bump 140 toward one side (first side), for example, the +y side, and at least another one of the multiple unit transistors 110 is arranged such that it is displaced from the center line 150 of the bump 140 toward another side (second side), for example, the −y side.

With this configuration, the positions of heat sources can be distributed more separately than the configuration in which the emitters 330 of all the unit transistors 110 are aligned along the center line 150 of the bump 140. Thus, in the compound semiconductor devices 100A through 100I, it is possible to reduce the thermal resistance to a smaller level than that in a case in which the emitters 330 of all the unit transistors 110 are aligned along the center line 150 of the bump 140.

In the compound semiconductor devices 100A through 100D, all the unit transistors 110 are entirely displaced from the center line 150 of the bump 140. However, some unit transistors 110 may be disposed on the center line 150. For instance, some or all unit transistors 110 may be disposed on the center line 150, but more to one side of the center line 150, such as in semiconductor devices 100E through 100I, and still achieve the benefit of reducing thermal resistance to a smaller level than that in a case in which the emitters 330 of all the unit transistors 110 are aligned along the center line 150 of the bump 140 (such as in FIG. 5A).

According to the preferred embodiments, the emitters 330 displaced from the center line 150 of the bump 140 may be partially exposed from the bump 140. With this configuration, stress to be applied to the emitters 330 can be reduced compared with a case in which the emitters 330 are entirely covered by the bump 140, thereby making it possible to prolong the life of the unit transistors 110.

According to the preferred embodiments, as in the compound semiconductor devices 100A, 100B, 100C, 100H, and 100I the emitters 330 of the multiple unit transistors 110 may be displaced from the center line 150 of the bump 140 alternately toward one side (for example, the +y side) and the other side (for example, the −y side). With this configuration, it is possible to reduce the thermal resistance to a smaller level than that in a case in which the emitters 330 of all the unit transistors 110 are aligned along the center line 150 of the bump 140.

According to the preferred embodiments, as in the compound semiconductor device 100D, the emitters 330 of the multiple unit transistors 110 may be displaced from the center line 150 of the bump 140 toward one side (for example, the +y side) and the other side (for example, the −y side) alternately by the group of multiple unit transistors 110. With this configuration, it is also possible to reduce the thermal resistance to a smaller level than a case in which the emitters 330 of all the unit transistors 110 are aligned along the center line 150 of the bump 140.

According to the preferred embodiments, a power amplifier module may be formed by using the HBT of any one of the semiconductor devices 100A to 100I as an amplifier element which amplifies an RF signal. With this configuration, a power amplifier module with a reduced level of thermal resistance can be formed. In the preferred embodiments, an example in which one of the semiconductor devices 100A to 100I is applied to the power amplifier module 1800 has been discussed. However, a semiconductor device according to an embodiment of the disclosure may find other applications than a power amplifier module.

According to the preferred embodiments, if a power amplifier module includes multiple stages of amplifiers, the HBT of any one of the semiconductor devices 100A to 100I may be used as an amplifier element in the amplifier at the final stage. By applying any one of the semiconductor devices 100A to 100I to the amplifier 1830 at the final stage having a greater amount of current, the effect of reducing the thermal resistance is enhanced.

The preferred embodiments described above are provided for facilitating understanding the disclosure, but are not intended to be exhaustive or to limit the disclosure to the precise forms disclosed. Modifications and/or improvements may be made to the disclosure without departing from the scope and spirit of the disclosure, and equivalents of the disclosure are also encompassed in the disclosure. That is, suitable design changes made to the preferred embodiments by those skilled in the art are also encompassed in the disclosure as long as they are within the scope and spirit of the disclosure. For example, the elements of the preferred embodiments and the positions, materials, conditions, configurations, and sizes thereof are not restricted to those described in the embodiments and may be changed in an appropriate manner.

While exemplary embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A compound semiconductor device comprising:
a heterojunction bipolar transistor including a plurality of unit transistors;
a capacitor electrically connected between a RF input wire and a base wire for each unit transistor of the plurality of unit transistors; and
a bump electrically connected to emitters of the plurality of unit transistors, wherein
the plurality of unit transistors are arranged in a first direction,
the bump is disposed above the emitters of the plurality of unit transistors while extending in the first direction,
the plurality of unit transistors include a first unit transistor and a second unit transistor, the emitter of the first unit transistor being disposed on a first side of a second direction with respect to a center line of the bump extending in the first direction, the emitter of the second unit transistor being disposed on a second side of the second direction with respect to the center line of the bump, the second direction being perpendicular to the first direction,
the capacitor is not covered by the bump, and
a length of the base wire connected to the first unit transistor is different from a length of the base wire connected to the second unit transistor.

2. The compound semiconductor device according to claim 1, wherein the length of the base wire connected to the first unit transistor is shorter than the length of the base wire connected to the second unit transistor.

3. The compound semiconductor device according to claim 1, wherein a capacitance of the capacitor connected to the first unit transistor is different from a capacitance of the capacitor connected to the second unit transistor.

4. The compound semiconductor device according to claim 1, wherein part of the emitter of each of the first and second unit transistors is not covered by the bump and the remaining part of the emitter is covered by the bump.

5. The compound semiconductor device according to claim 1, wherein:
the plurality of unit transistors include a plurality of the first unit transistors and a plurality of the second unit transistors; and
the emitters of the plurality of first unit transistors and the emitters of the plurality of second unit transistors are disposed on the first side and the second side with respect to the center line of the bump alternately one by one.

6. The compound semiconductor device according to claim 1, wherein:
the plurality of unit transistors include a plurality of the first unit transistors and a plurality of the second unit transistors; and
the emitters of the plurality of first unit transistors and the emitters of the plurality of second unit transistors are disposed on the first side and the second side with respect to the center line of the bump alternately by a group of a plurality of the first unit transistors and a plurality of the second unit transistors, respectively.

7. The compound semiconductor device according to claim 1, wherein the emitters of the first and second unit transistors are disposed so as not to overlap the center line of the bump.

8. The compound semiconductor device according to claim 1, wherein a center line of the emitter of the first unit transistor extending in the second direction does not overlap a center line of the emitter of the second unit transistor extending in the second direction, as viewed from the second direction.

9. The compound semiconductor device according to claim 5, wherein:
part of the emitter of each of the plurality of first and second unit transistors is not covered by the bump and the remaining part of the emitter is covered by the bump; and
a distance between the center line of the bump and a center line of each of the plurality of first unit transistors extending in the first direction and a distance between the center line of the bump and a center line of each of the plurality of second unit transistors extending in the first direction is about 10 to 30 μm.

10. The compound semiconductor device according to claim 9, wherein a length of the part of the emitter of each of the plurality of first and second unit transistors which is not covered by the bump in the second direction is about 0 to 12.5 μm.

11. A power amplifier module comprising:
the compound semiconductor device according to claim 1,
wherein the heterojunction bipolar transistor is an amplifier element which amplifies a radio-frequency signal.

12. The power amplifier module according to claim 11, wherein:
the power amplifier module includes a plurality of stages of amplifiers; and the heterojunction bipolar transistor is the amplifier element of the amplifier at the final stage among the plurality of stages of amplifiers.

13. The compound semiconductor device according to claim 4, wherein:

the plurality of unit transistors include a plurality of the first unit transistors and a plurality of the second unit transistors; and the emitters of the plurality of first unit transistors and the emitters of the plurality of second unit transistors are disposed on the first side and the second side with respect to the center line of the bump alternately one by one.

14. The compound semiconductor device according to claim 4, wherein:

the plurality of unit transistors include a plurality of the first unit transistors and a plurality of the second unit transistors; and the emitters of the plurality of first unit transistors and the emitters of the plurality of second unit transistors are disposed on the first side and the second side with respect to the center line of the bump alternately by a group of a plurality of the first unit transistors and a plurality of the second unit transistors, respectively.

15. The compound semiconductor device according to claim 4, wherein the emitters of the first and second unit transistors are disposed so as not to overlap the center line of the bump.

16. The compound semiconductor device according to claim 5, wherein the emitters of the first and second unit transistors are disposed so as not to overlap the center line of the bump.

17. The compound semiconductor device according to claim 6, wherein the emitters of the first and second unit transistors are disposed so as not to overlap the center line of the bump.

* * * * *